(12) United States Patent
Walpole et al.

(10) Patent No.: US 6,928,223 B2
(45) Date of Patent: Aug. 9, 2005

(54) STAB-COUPLED OPTICAL WAVEGUIDE LASER AND AMPLIFIER

(75) Inventors: James N. Walpole, Concord, MA (US); Joseph P. Donnelly, Carlisle, MA (US); Stephen R. Chinn, Westford, MA (US)

(73) Assignee: Massachusetts Institute of Technology, Cambridge, MA (US)

( * ) Notice: Subject to any disclaimer, the term of this patent is extended or adjusted under 35 U.S.C. 154(b) by 0 days.

(21) Appl. No.: 09/903,099

(22) Filed: Jul. 11, 2001

(65) Prior Publication Data

US 2002/0051615 A1 May 2, 2002

Related U.S. Application Data

(60) Provisional application No. 60/218,187, filed on Jul. 14, 2000.

(51) Int. Cl.[7] .................................................. G02B 6/10
(52) U.S. Cl. ...................................................... 385/131
(58) Field of Search ................................ 385/129–132; 359/344; 372/7

(56) References Cited

U.S. PATENT DOCUMENTS

| | | | |
|---|---|---|---|
| 3,899,235 A | 8/1975 | Arnaud et al. | 350/96 WG |
| 4,691,321 A | 9/1987 | Motegi et al. | 372/46 |
| 4,776,655 A | 10/1988 | Robertson et al. | 350/96.12 |
| 4,787,086 A | 11/1988 | Dentai et al. | 372/19 |
| 4,791,646 A | 12/1988 | Lindsey et al. | |
| 4,799,228 A | 1/1989 | Nagasaka et al. | 372/46 |
| 5,272,711 A | 12/1993 | Mawst et al. | 372/45 |
| 5,606,570 A | 2/1997 | Botez et al. | 372/50 |
| 5,818,860 A | 10/1998 | Garbuzov et al. | 372/45 |
| 6,167,073 A | 12/2000 | Botez et al. | 372/46 |

OTHER PUBLICATIONS

"A Real Index Guideed InGaA 1 P Visible Laser Diode with a Small Beam Astigmatism," Okajima et al. IEEE Journal of Quantum Electronics. Jun., 1991. No. 6.

Primary Examiner—Euncha P. Cherry
(74) Attorney, Agent, or Firm—Gauthier & Connors LLP

(57) ABSTRACT

A laser and optical amplifier waveguide device with a plurality of layers that supports a single lowest-order optical mode with gain while higher order modes radiate and have a net loss. The supported lowest-order mode which has gain, has a mode cross section which is large compared to the operating optical wavelength in both the transverse and lateral directions. The contours of constant optical intensity of such lowest-order can be nearly circular, having an approximately elliptical shape with a small aspect ratio.

82 Claims, 25 Drawing Sheets

STAB-COUPLED OPTICAL WAVEGUIDE LASER AND AMPLIFIER

PRIORITY INFORMATION

This application claims priority from provisional application Ser. No. 60/218,187 filed Jul. 14, 2000.

This invention was made with government support under Grant No. F19628-95-C-0002 awarded by the Air Force. The government has certain rights in the invention.

BACKGROUND OF THE INVENTION

The invention relates to a slab-coupled optical waveguide laser (SCOWL) and amplifier.

Arnaud et al., U.S. Pat. No. 3,899,235 and Marcatili, Bell System Technical Journal, vol. 53, no. 4, pp. 645–674, April, 1974, describe a theory of slab-coupled optical waveguides which shows that it is possible to construct a passive dielectric optical waveguide in which only the fundamental, lowest-order spatial mode propagates without loss. The lowest-order spatial mode represents a single-lobed distribution of light (or electromagnetic intensity) in both the lateral and transverse directions. The lateral and transverse directions are defined as being mutually perpendicular to each other and to the direction of wave propagation, i.e., the longitudinal direction. Conventionally, "lateral" refers to the dimension parallel to the epitaxial layers of the structure, while "transverse" refers to the dimension perpendicular to the layered structure.

The theory also includes design rules for constructing dielectric structures of this type. In general the structures consists of a dielectric slab that is very wide (infinitely wide, as described in the theory) in the lateral direction and a waveguiding region that is localized in the lateral and transverse directions. The dielectric slab and the localized waveguide can be described as two systems that are optically coupled together, i.e., the infinite slab and the localized waveguide.

SUMMARY OF THE INVENTION

A high-brightness diode (semiconductor) laser (and amplifier) structure is proposed which utilizes a slab-coupled optical waveguide region to achieve several potentially important advances in performance. The devices can be made to operate in most of the wavelength regions of interest for conventional technology, for pumping of fiber and solid-state lasers and amplifiers, optical countermeasures, laser radar, and for compact, efficient high-power lasers or amplifiers in fiber optical systems.

The slab-coupled waveguide can be designed to support a single lateral and transverse mode even though the waveguide cross section is large compared to the optical wavelength. The large mode cross section makes possible greatly enhanced coupling efficiency into and out of optical fibers, using simple butt coupling with no other optical components required. In addition, the large mode makes possible designs for the active device which minimize the effects of free carriers that cause optical loss, but which still allow overlap of the mode with a region of inverted carrier population, to achieve the required optical gain. Because losses can be made very small ($\sim 0.5$ cm$^{-1}$ or less), very long gain (or cavity) lengths (1–2 cm) are possible, so that the electrical pumping (and consequently, heating) per unit length is reduced by up to an order of magnitude over current diode laser designs. The large mode also reduces the optical intensity for the same power, thus reducing nonlinearities and the possibility of catastrophic facet damage.

These devices should be capable of up to two or more times the output power of current high-brightness lasers and amplifiers, such as tapered laser devices. Moreover, since nearly all the power is in a fundamental lowest-spatial-mode pattern, nearly all the power can be utilized, compared to, at best, about 65% of the output of a tapered device. Hence the useful power in a single spatial mode should be at least on the order of 4 times that now available.

The design also should permit relatively easy realization of passive-active interfaces for integrated optical devices. High mode overlap at such longitudinal interfaces should be simple to achieve because of the large modal cross-sectional areas, with minimal disruption of the structure required to etch away active portions of the wafer before regrowth.

DETAILED DESCRIPTION OF THE INVENTION

Figure 1:
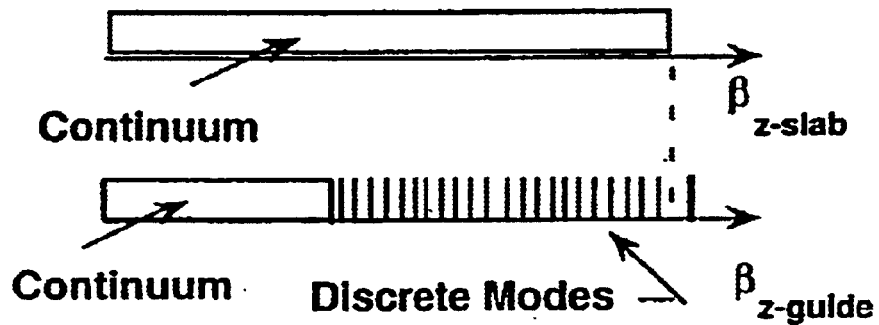
FIG. 1 is a functional block diagram illustrating a waveguide with discrete and continuum modes coupled to an infinite slab waveguide with a continuum of propagating modes.
Figure 1:
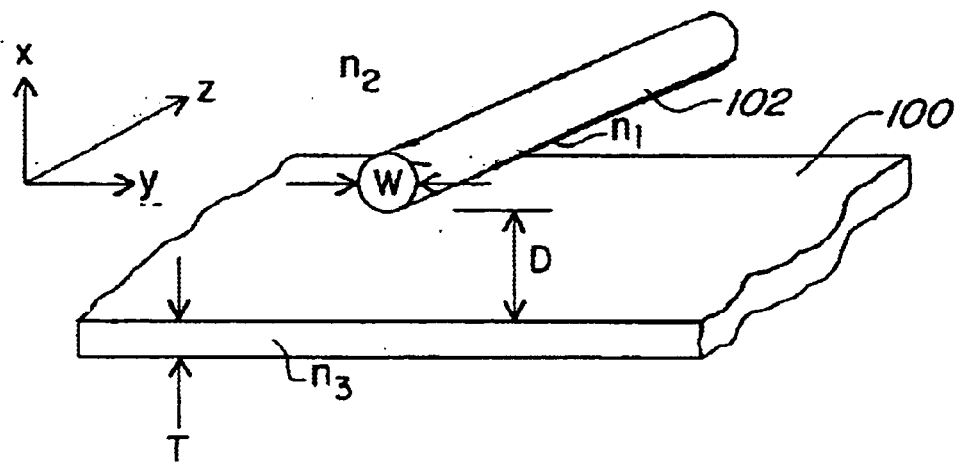

FIG. 1 is a functional block diagram illustrating a waveguide 102 with discrete (bound) modes coupled to an infinite slab waveguide 100 with a continuum of propagating modes. If the dimensions of the slab 100 and the waveguide 102 are chosen so that the continuum of values for the z-component of the propagation constant of the slab has a cut off just below the value of the first discrete mode of the waveguide, then all the rest of the modes of the waveguide will couple to the slab modes and their energy will radiate into the slab so that they are not bound modes of the combined structure.

Figure 2:
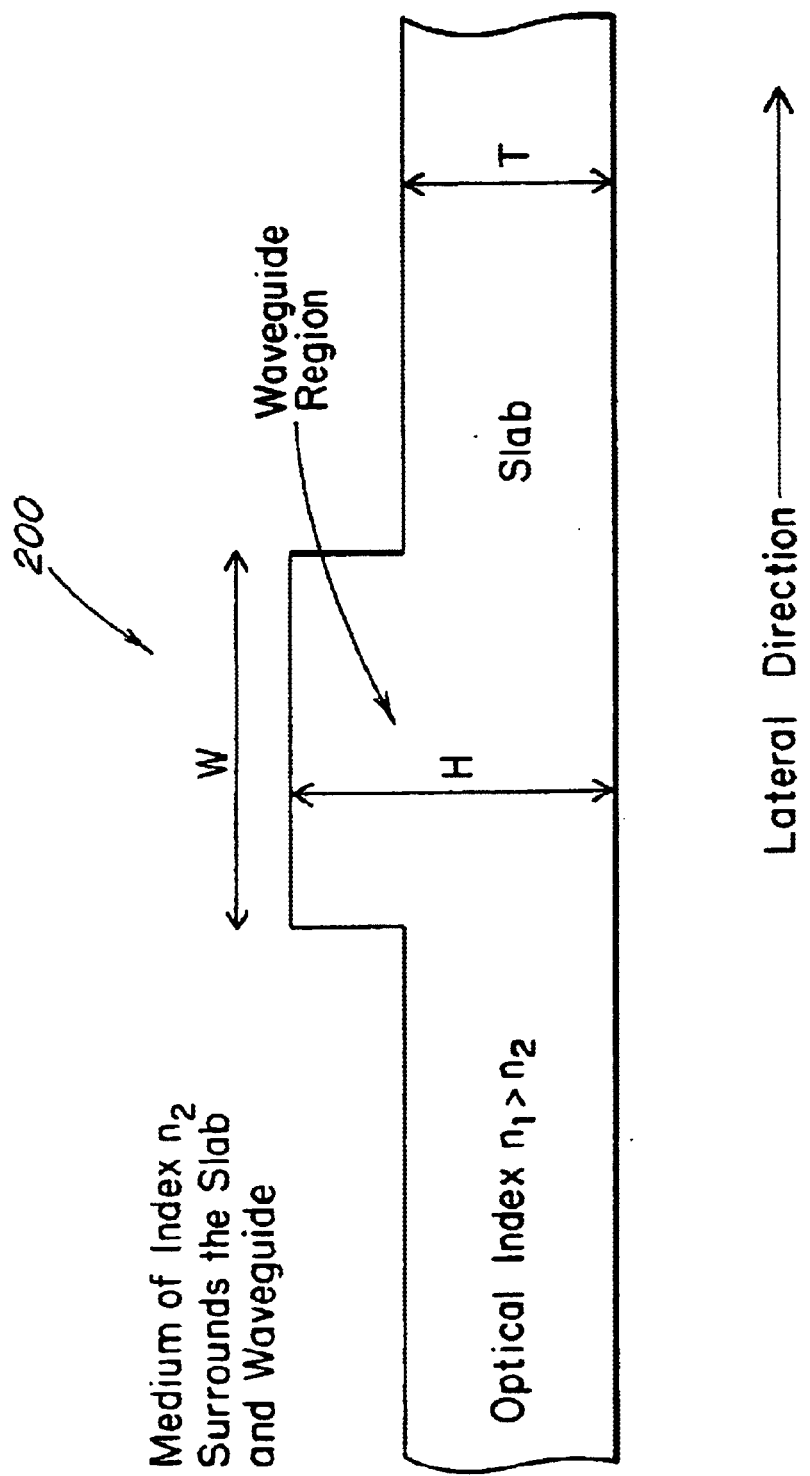
FIG. 2 is a cross section of a simple slab-coupled optical waveguide in a plane perpendicular to the longitudinal axis.

A geometry with the cross section shown in FIG. 2, in a plane perpendicular to the longitudinal axis, is a very simple slab-coupled optical waveguide 200 that is relatively easy to model. The slab is considered as being infinitely wide in the lateral direction. The dimensions W, H, and T, along with the indices $n_1$, and $n_2$, determine the properties of the waveguiding system.

Proper choice of the dimensions and indices will allow only the lowest order mode to propagate along the longitudinal direction without loss. This mode is substantially localized within the region that is W by H in dimensions, which will be denoted as the ridge region. All the higher-order modes of the system will couple into the modes of the slab and radiate their energy laterally out to infinity. It is important to note that the single-mode behavior of the slab-coupled optical waveguide occurs for arbitrarily large values of the dimensions W and H provided the ratios of W to H and T to H fall within certain limits.

The importance of this fact is that normally a semiconductor waveguide structure becomes "over-moded", i.e., supports higher-order modes, when its physical dimensions are on the order of (and especially when several times larger than) the wavelength of the optical field in the medium with index $n_1$. When the index difference, $n_1$-$n_2$, becomes very small, as in glass fibers, it is possible for the mode to be an order of magnitude larger in diameter than the wavelength in the medium. However, this is not usually feasible for active semiconductor devices because of other considerations involving requirements for carrier confinement. For the slab-coupled optical waveguide, the lateral and transverse dimensions of the lowest order spatial mode (approximately W and H), can be very large compared to the wavelength of light in the medium of index $n_1$.

As mentioned, the theory for the slab-coupled waveguide strictly applies only to passive (no gain) systems. Although not explicitly addressed in this theory, for finite width of the slab region, it might be assumed that small amounts of loss could be introduced to maintain lossy propagation of the higher-order modes. This loss might be due to absorption or scattering distributed within the slab or at its top or bottom boundaries or at its edges. While small losses probably can be introduced without substantially altering the theoretical predictions, a more interesting question is whether, and under what circumstances, it is possible to introduce sufficient gain in some part of the optical waveguide so that the lowest-order spatial mode has net modal gain while still maintaining the property of supporting only the lowest-order spatial mode. In this context it is meant that only the lowest-order spatial mode would experience net gain; the rest should couple to the slab modes and experience net loss. If one can achieve this situation, then it should be possible to make a semiconductor laser or optical amplifier that has the modal properties of the slab-coupled optical waveguide, viz., only a single, lowest-order propagating mode localized to the ridge region which has net gain and modal dimensions large compared to the optical wavelength in the medium.

Lasers that operate in a single spatial mode with lateral and transverse dimensions larger than the wavelength have been achieved in systems that utilize external optical cavities without lateral or transverse optical waveguiding. These are typically lasers whose modal properties are determined by external mirror systems, and they are physically large and mechanically complicated devices. Fiber lasers also can achieve large single-mode diameters as mentioned earlier for glass fibers. Semiconductor lasers (unless also operated in external cavities) are generally much smaller devices than either external cavity lasers or fiber lasers, and they have uniquely high conversion efficiency from electrical pump power to laser power. The prior art for these devices, however, has not been able to achieve lasers that operate in a single spatial mode with both lateral and transverse dimensions several times larger than the wavelength.

Semiconductor lasers have an inherent, built-in optical waveguide, which involves relatively large indices and large variations in index. One way that the usual over-moded limitation of optical waveguides can be avoided appears to be to extend the passive slab-coupled waveguide concept to the active semiconductor optical waveguide.

It is not obvious that this extension is possible without solving for the modes of active, lossy, index-guided structures. Applicants have modeled suitable structures using a commercially available software package that includes a "complex mode solver". This software solves the three-dimensional equations for electromagnetic mode propagation in dielectric waveguides containing loss and gain. It is called a "complex mode solver" because, mathematically, the addition of loss and gain to the dielectric medium can be treated by utilizing complex numerical notation in which the gain and loss are determined by the imaginary part of the refractive index.

There are two problems to overcome in designing a slab-coupled optical waveguide laser. The first is the fact that if a waveguide is designed in which gain is localized within a region such as the ridge region of FIG. 2; and loss is localized outside that region in the slab, then general theoretical considerations show that higher-order gain-guided modes can propagate within the ridge region with net gain, if the dimensions of W or H are large compared to a wavelength. One may think of this waveguiding mechanism as waveguiding that results from spatial variations of the imaginary part of the refractive index, rather than the real part. Indeed, it is very easy to demonstrate this type of waveguiding with the complex mode solver.

The second problem is that, in order for the lasers to produce useful power on a continuous wave (cw) basis, the gain region will require electrical pumping that will inevitably produce waste heat. Consequently, the gain region in the ridge section will become hotter than the slab regions. Since the refractive index increases with increasing temperature, the index can increase sufficiently that the design rules for maintaining the coupling to the slab of the higher-order modes may be violated.

The invention allows for the design of an active slab-coupled optical waveguide laser so that it's lowest-order mode has very low residual background loss. The residual background loss is due to scattering from optical irregularities and from absorption due to free carriers (electrons and holes) that are needed in the structure to provide current flow to the gain region as well as needed to provide the gain. This loss is conventionally represented by a loss coefficient, $\alpha_L$, which has dimensions of $cm^{-1}$ and determines the rate of loss of energy with distance as the mode propagates along the longitudinal direction.

The differential quantum efficiency of a laser $\eta_D$ (number of photons out for each additional electron injected to produce gain above threshold) is given approximately by $$\eta_D = \alpha_M/(\alpha_M + \alpha_L)$$

where $\alpha_M$ is an equivalent distributed loss coefficient that represents the localized loss due to output coupling at the mirrors (dimensions of $cm^{-1}$). At threshold and above, the gain coefficient $\gamma$ is equal to the total loss, that is, $\gamma = (\alpha_M + \alpha_L)$. Accordingly, if the laser is to have good quantum efficiency, $\alpha_L$ must be small compared to $\alpha_M$. The smaller $\alpha_L$ can be made, the smaller $\alpha_M$ and hence $\gamma$ can be made, and still maintain good efficiency. Only by making $\gamma$ small can one avoid the two problems discussed above, gain guiding and thermal guiding. Gain guiding is obviously reduced by making the gain small, and thermal guiding can be reduced as well since, if the needed gain is small, relatively small current per unit length will be needed to produce the gain.

In addition, the device can be designed so that most of the modal volume of the desired mode does not experience significant heating. This is achieved by heat sinking the device on the junction side while most of the modal volume is relatively far away from the heat source and heat sink.

Figure 3:
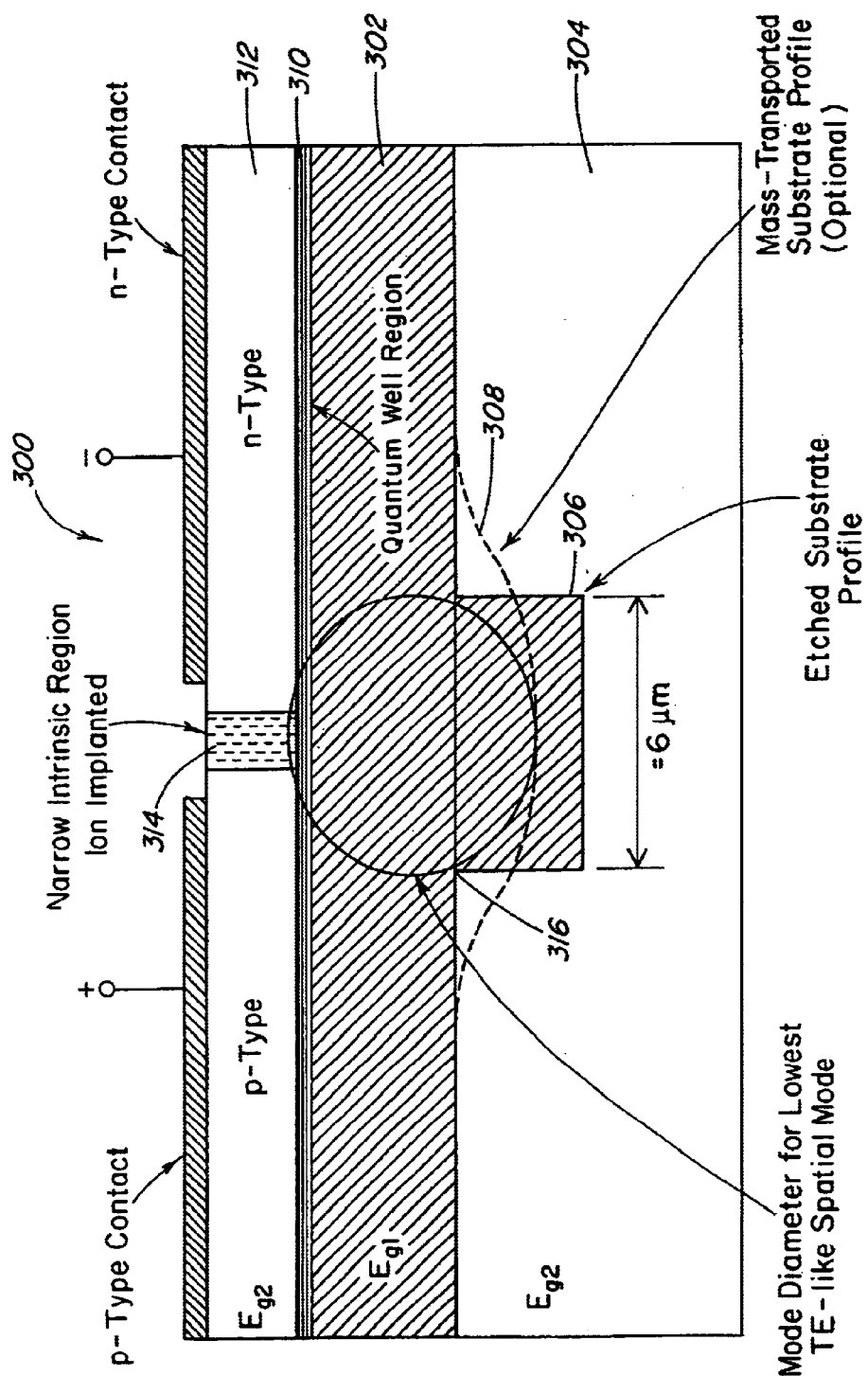
FIG. 3 is a cross-section view of an exemplary slab-coupled optical waveguide laser in accordance with the invention.

FIG. 3 is a cross-section view of an exemplary slab-coupled optical waveguide laser 300 in accordance with the invention. While there are many possible variations that can be envisioned within the scope of the invention, the SCOWL of FIG. 3 is provided for purposes of illustration. The cross-hatched region 302 of energy gap $E_{g1}$, has been formed by regrowth of an undoped layer over an undoped substrate 304 that has been etched to produce a groove 306 shown to be about 6 $\mu m$ wide. Alternatively, the groove could be mass transported to form a smoother profile and perhaps a better shaped bound mode 308.

Immediately above the undoped region of energy gap $E_{g1}$, a thin region 310, including one or more quantum wells and comprising the active gain region, is shown. This region would have an energy gap less then $E_{g1}$, and the quantum wells a still smaller gap. The largest energy gap, $E_{g2}$, would be used in the substrate and the top cladding regions 312. The top cladding would probably be grown with moderate n-type doping. Subsequently, the conductivity type would be selectively altered by ion implantation or diffusion to obtain a transverse p-n junction centered over the bound-mode region. It would be necessary for good injection of carriers near the quantum wells to implant a narrow region 314 over the transverse junction to obtain a semi-insulating conductivity region. This embodiment is designed to produce the smallest possible loss coefficient for the desired mode. Use of a transverse junction allows most of the waveguide region to be essentially carrier free, greatly reducing the free carrier absorption.

The etched (or etched and transported) groove 306 has a depth and width that, together with the refractive indices of the various regions, determine the modal properties of the waveguide. It should be theoretically possible to obtain a nearly circular mode 316 that for latticed-matched and compressively strained quantum wells is TE-like where it overlaps the quantum-well region, with no other modes that experience low loss since these other modes are coupled to the slab and radiate away. For tensile-strained quantum wells, similar TM-like operation should be achieved. In amplifiers, equal TE and TM gain could be achieved by appropriately tailoring the gain region. In practice, since the device is not infinitely wide, it may be necessary to saw cut the side walls of the device or etch down and perform ion implantation into the outer regions of the guiding layer to provide sufficient loss at the edges of the device, as will be described more fully hereinafter. The unpumped quantum well regions will also contribute to the loss of the higher order modes.

Additional selective loss in the outer slab regions that effects only the higher modes and not the desired lowest order mode can be achieved by selectively bombarding these outer lateral slab regions with protons or heavier ions to generate defects which increase optical loss only in these outer regions. These outer regions can also be selectively doped, either with high levels of donors or acceptors, by selective ion implantation, selective diffusion or selective epitaxial regrowth, to provide additional free carrier loss in these regions. The outer sidewalls on actual chips, which are limited in extent in the lateral directions, can also be roughened to provide additional loss for the higher modes that couple to the slab region. None of these methods will increase the loss of the desired lowest order mode while increasing the loss of the higher order modes and therefore increasing the mode selectivity of the device. These techniques for selectively increasing the loss of the higher modes are applicable to the other SCOWL embodiments illustrated herein.

The ability to design SCOWL devices with near-circular lowest order modes simplifies coupling to single-mode fibers. In addition, the ability to make large single-mode devices, in which the lowest order mode is comparable in size to the fiber mode allows for simple butt coupling to a cleaved fiber without the need of lenses. For an ideal Gaussian beam with elliptical cross-sectional intensity contours, the beam is described by the two beam-waist parameters, $w_x$ and $w_y$, which are the intersections of the 13.5% intensity contour with the x and y axes in the cross-sectional plane.

The maximum coupling between the elliptical beam and a round beam occurs when the round beam-waist parameter, $w_o$, is equal to the geometric mean of the two elliptical beam-waist parameters, i.e., when $w_o$ is equal to the square root of ($w_x w_y$). The maximum power coupling is then determined by the aspect ratio, $A = w_y/w_x$, only. The maximum coupling is 100% for an aspect ration of 1, and 75% for an aspect ratio of three and 88.9% for an aspect ratio of two. Hence, when the aspect ratio is less than about three the power coupling is already very large. Neither SCOWL or fiber modes are ideal Gaussian beams, but these aspect ratios are a reasonable guide to predicting coupling efficiency of a SCOWL mode with an approximate elliptical shape to a single-mode fiber. The general device features of the exemplary embodiment of FIG. 3 and of the other SCOWL embodiments illustrated herein can be adapted to all semiconductor alloy systems and different wavelengths.

The exemplary embodiment of FIG. 3 is designed for a minimum loss coefficient. If loss coefficients of about 0.5 cm$^{-1}$ are acceptable, a much easier device to manufacture can be designed, as described below. This embodiment also introduces additional ideas for creating loss for the slab-coupled modes and addresses a waveguiding issue that can become important with larger thicknesses of the ridge region, labeled H in FIG. 2.

Figure 4:
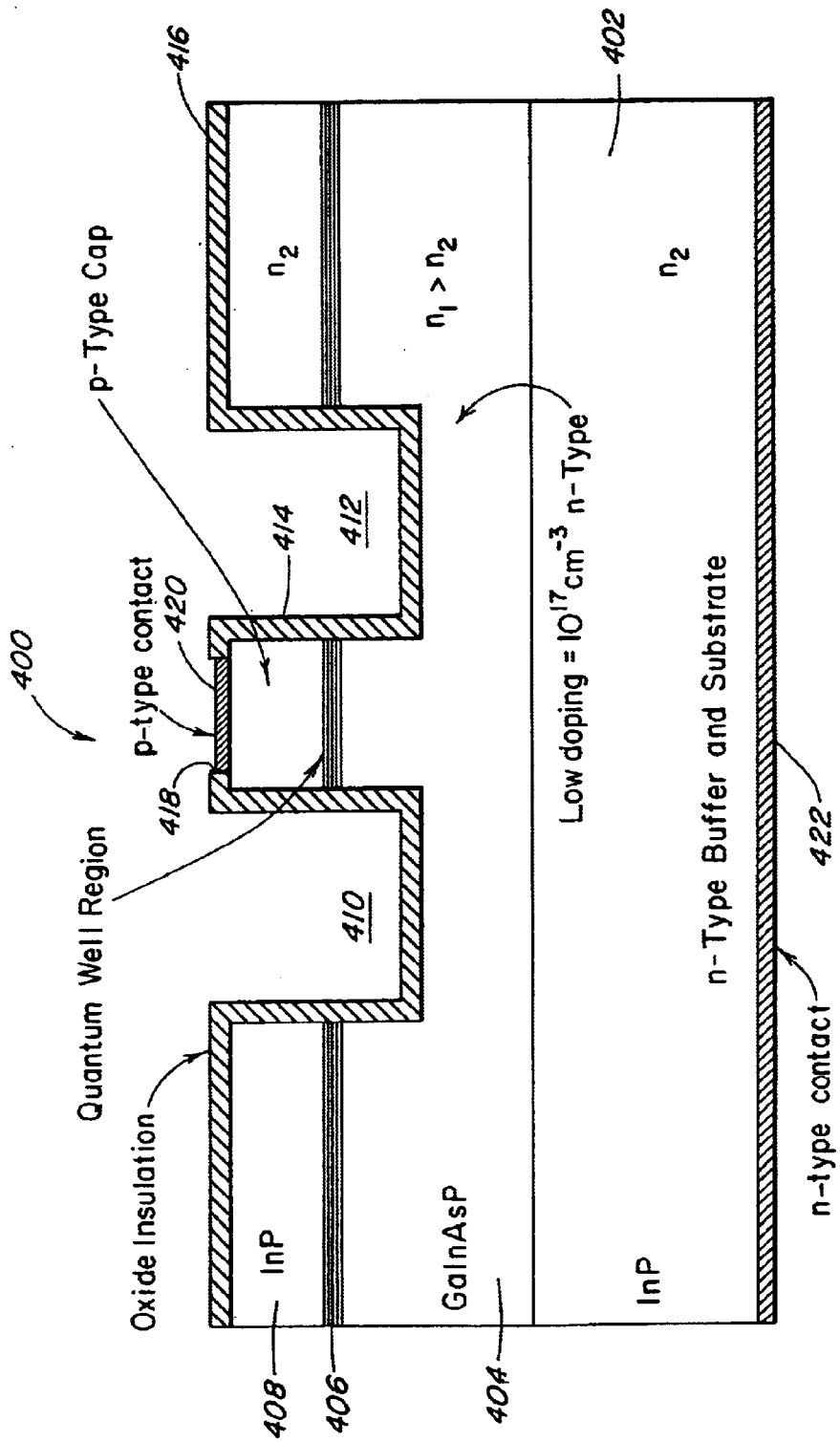
FIG. 4 is a cross section view of an exemplary SCOWL structure for moderately low loss coefficient.

Instead of keeping most of the modal volume free of carriers, an alternative exemplary embodiment of the invention allows for n-type doping, up to about a level of $10^{17}$ cm$^{-3}$, within the ridge and slab regions, as shown in the cross-sectional view of FIG. 4. FIG. 4 is a cross section view of an exemplary SCOWL structure 400 for moderately low loss coefficient.

Specifically, fabrication in the GaInAsP/InP material system for laser operation near 1.3-$\mu$m wavelength is described, since this is directly relevant to the experimental work discussed below. The general design features can be adapted to other semiconductor alloy systems and different wavelengths. Initially, a GaInAsP layer 404 is provided on a n-type buffer and substrate (InP) 402. Thereafter, a quantum well region 406 and a p-type InP cap layer 408 are subsequently fabricated. Grooves 410, 412 are configured by etching or other conventional manner, thus forming a ridge structure 414. Finally, a thin oxide insulation layer 416 covers the entire surface except for an opening area 418 on the ridge surface in which the metal contact 420 to the p-type material is made. The metal contact 422 to the n-type material is made on the back side of the substrate.

In FIG. 4, the formation of the ridge structure is done after all growth of the wafer is completed. In fact, no regrowth is required, though it may be desirable to regrow semi-insulating, high-energy-gap material in the grooves on either side of the ridge before depositing the oxide insulator. In any case, current can flow in this structure through the contact 420 in the oxide opening 418, down through the quantum well region and the GaInAsP layer in the ridge section and finally into the substrate and out the back contact 422, in a manner similar to conventional semiconductor lasers. Losses can still be less than 0.5 cm$^{-1}$. This structure includes a different type of slab region. The portion of the slab region adjacent to the central ridge is similar to the slab regions of FIGS. 2 and 3, but then at the outer edges of the structure, the waveguide returns to the same thickness and structure that it has in the ridge region. However, the quantum well region in these outer regions is unpumped because of the oxide insulator, and detailed modeling shows these unpumped regions provide significant loss for the slab-coupled modes. This more generally shaped slab still functions to couple the higher order modes into the outer lossy regions as confirmed by computer modeling.

Figure 5:
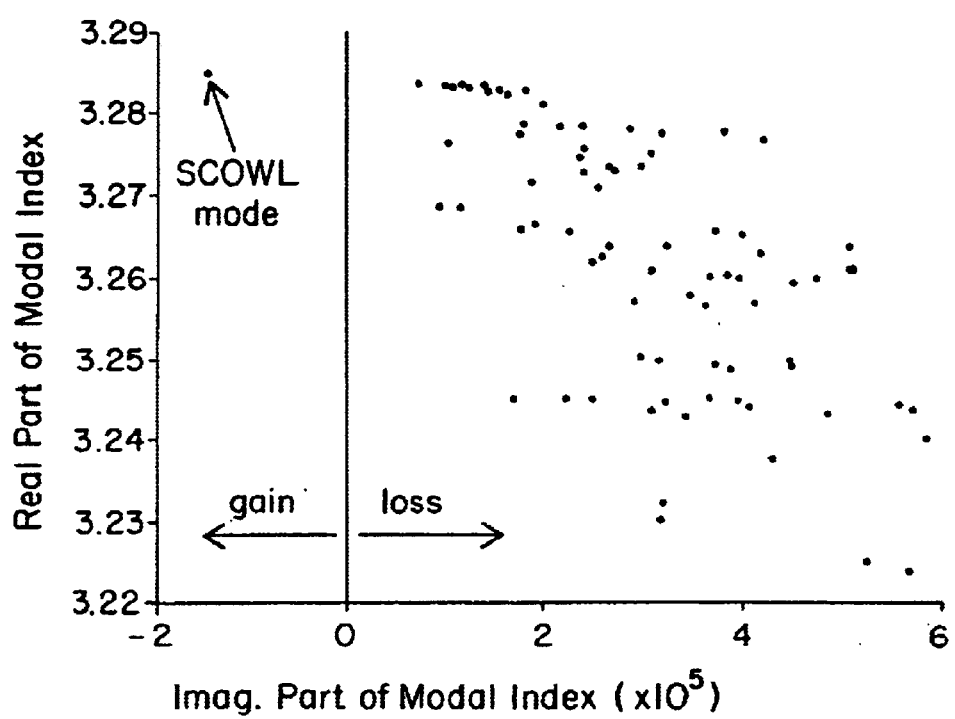
FIG. 5 is a graph showing the values of the complex modal index of quasi-TE-polarized modes that were calculated using a computer model for a waveguide that is designed in accordance with FIG. 4.

FIG. 5 is a graph showing the values of the complex modal index of quasi-TE-polarized modes that were calculated using a computer model for a waveguide that is designed in accordance with FIG. 4. The dimensions W=5 $\mu$m, H=4 $\mu$m, and T=3.7 $\mu$m are adjusted so that only the lowest spatial mode has gain. The grooves on either side of the ridge were 50 $\mu$m wide and the outer unpumped thick regions are 100 $\mu$m wide. Note that the loss coefficient is given by $4\pi/\lambda$ times the imaginary part of the modal index, which for $\lambda$=1.3 $\mu$m is about $10^5$ times the imaginary part of the modal index when the loss coefficient is expressed in units of cm$^{-1}$. It is necessary to calculate the eigenvalues of the modal index to be sure that a higher order mode does not have gain. Compared to values of W, H, and T for which single mode behavior occurs without gain, it is usually necessary to increase the value of T when gain is present, until no higher order modes have gain.

Figure 6:
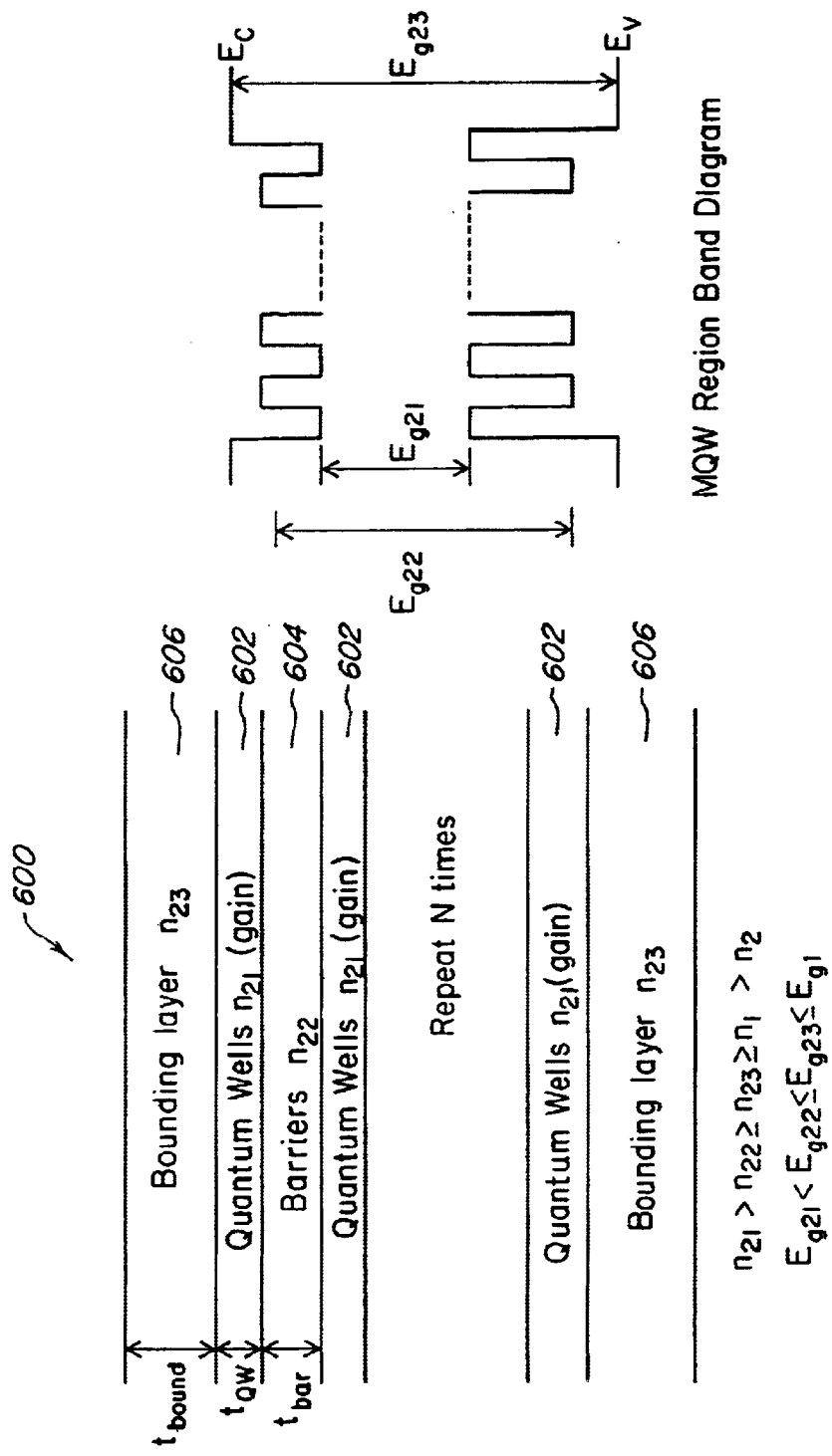
FIG. 6 is a cross section of an exemplary generic multi-quantum-well (MQW) region.

FIG. 6 is a cross section of an exemplary generic multi-quantum-well (MQW) region 600. The gain is located within the quantum wells, which are narrow regions 602 (5 to 15 nm wide) of energy gap $E_{21}$ and index $n_{21}$. There can be a single quantum well within the region or multiple quantum wells (up to about 5 is common). The wells are separated by barriers 604 and the region is bounded on both sides by bounding layers 606 obeying the inequalities for the values of the energy gaps and indices shown in the figure. $E_{g1}$ and $n_1$ are the energy gap and refractive index, respectively, of the waveguide region and $n_2$ is the refractive index of the cladding regions.

Figure 7:
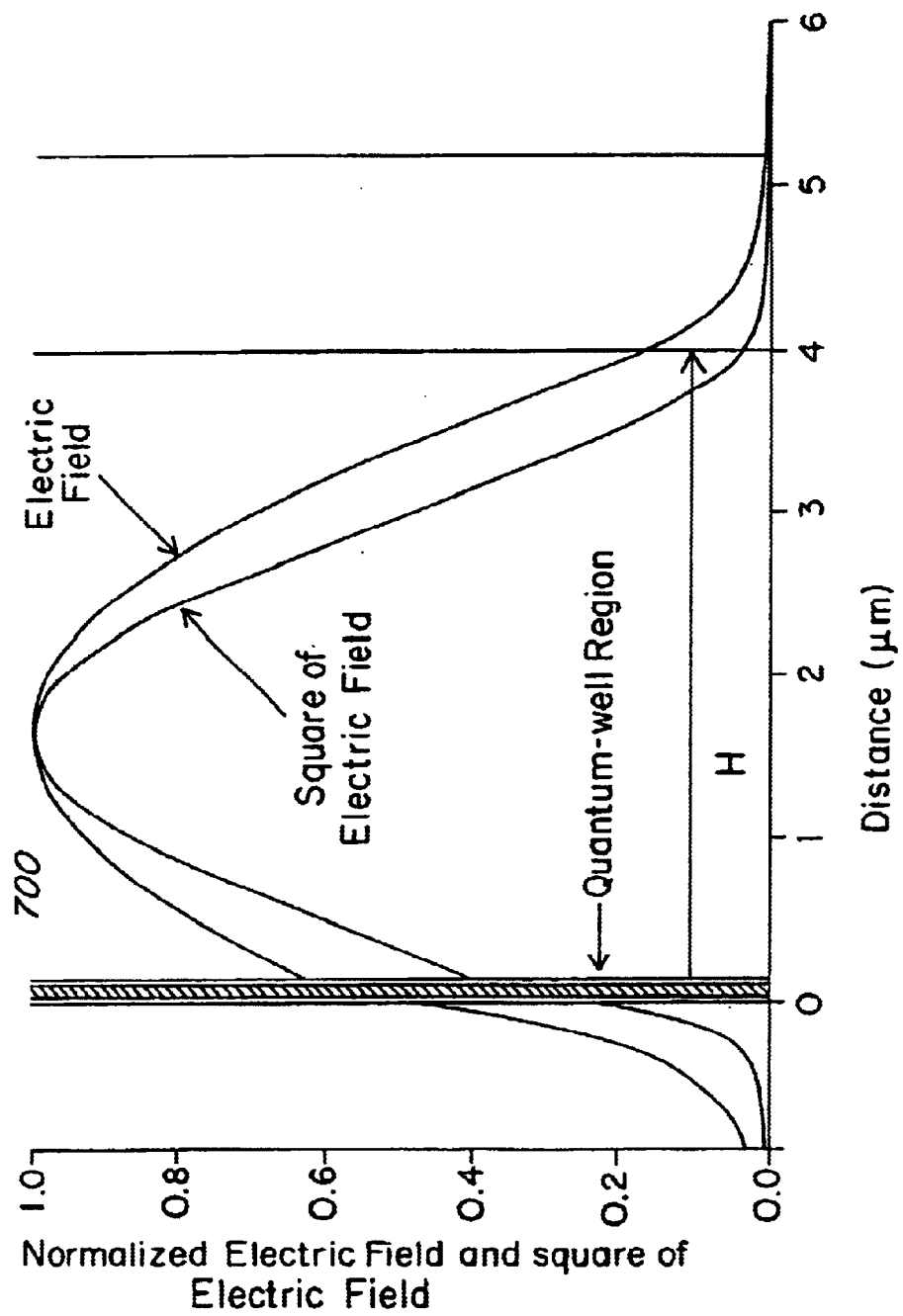
FIG. 7 is a graph of electric field and electric field squared vs. distance in the transverse direction through the center of the ridge region of a SCOWL structure designed in accordance with FIG. 4.

FIG. 7 is a graph of electric field and electric field squared vs. distance in the transverse direction through the center of the ridge region of the SCOWL structure 400 of FIG. 4. A vertical solid bar 700 in FIG. 7 indicates the entire quantum-well region. The figure shows the calculated electric field E (upper curve) and the field intensity (the square of the electric field which is the lower curve) in the transverse direction through the center of the ridge for the structure of FIG. 4 with a 5-quantum-well gain region. The modal gain, $\gamma$, is approximately determined by the following expression:

$$\gamma = \{g(x,y)|E(x,y)|^2 dx\, dy\} / \{|E(x,y)|^2 dx\, dy\},$$

where $g(x,y)$ is the local material gain as a function of position x and y in a cross section of the waveguide structure and $|E(x,y)|^2$ is the electric field squared as a function of x and y. The function $g(x,y)$ is zero except in the quantum wells where it is essentially a constant that will be denoted go. Hence, the modal gain is approximately, $\gamma = g_0 \Gamma$, where $\Gamma$ is the confinement factor and is approximately given by the expression $$\Gamma = \{_{QW} |E(x,y)|^2 dx\, dy\} / \{_{INF} |E(x,y)|^2 dx\, dy\}.$$

Figure 8:
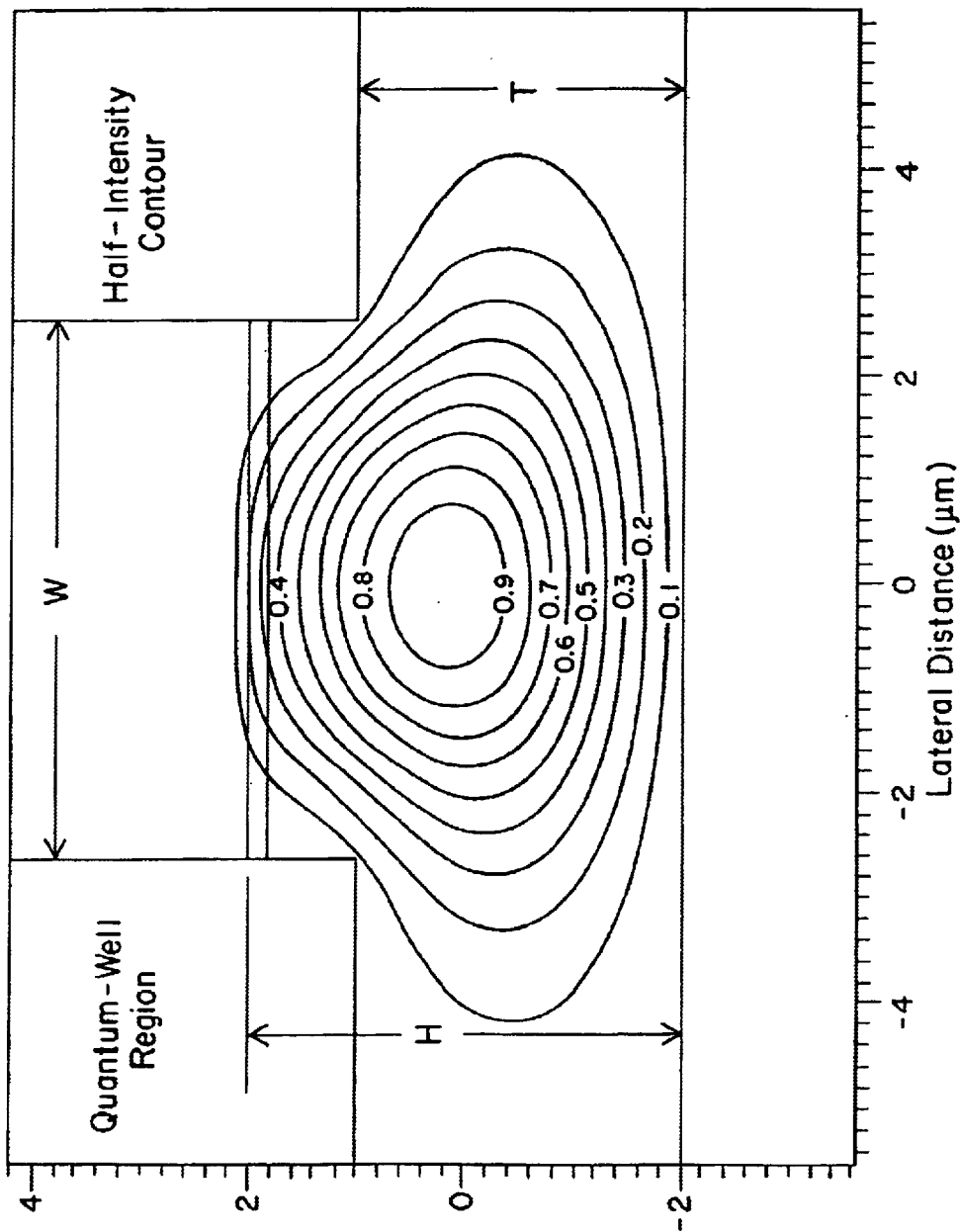
FIG. 8 is a two-dimensional contour plot of the electric field squared in the ridge region of the SCOWL structure of FIG. 4 and superimposed on lines representing the boundaries of the regions shown in FIG. 5.

Here $_{QW}$ indicates integration over the area of the quantum wells and $_{INF}$ indicates integration over all space. As can be seen from FIG. 7, the value of $|E(x,y)|^2$ is small in the region of the quantum wells and the width of the quantum wells is small compared to the total width of the mode. In two dimensions, the relative size of the integration over the mode vs. the integration over the quantum wells is illustrated in FIG. 8, which shows a two-dimensional contour plot of the electric field squared ($|E(x,y)|^2$) in the ridge region of the SCOWL structure 400 of FIG. 4. For the same values of W, H, and T discussed above, the confinement factor calculated is about 0.002, an order of magnitude less than values of $\Gamma$ used in conventional diode lasers.

In principle, one can make the structure shown in FIG. 4 with larger values of W, H, and T than those discussed, so far. However, as H is increased, there is a tendency for an undesired mode to arise. As the thickness of the GaInAsP layer is increased, the desired mode is confined more strongly to that layer and overlaps the gain region less until it becomes necessary to improve the overlap of the mode with the gain region to increase the gain. If one simply increases the width of the quantum-well region or moves the quantum-well region down into the waveguide, a new type of mode, confined by the quantum well region and having large gain, can be supported. This mode is much narrower in the transverse direction (perpendicular to the layered structure) than the desired mode.

Figure 9:
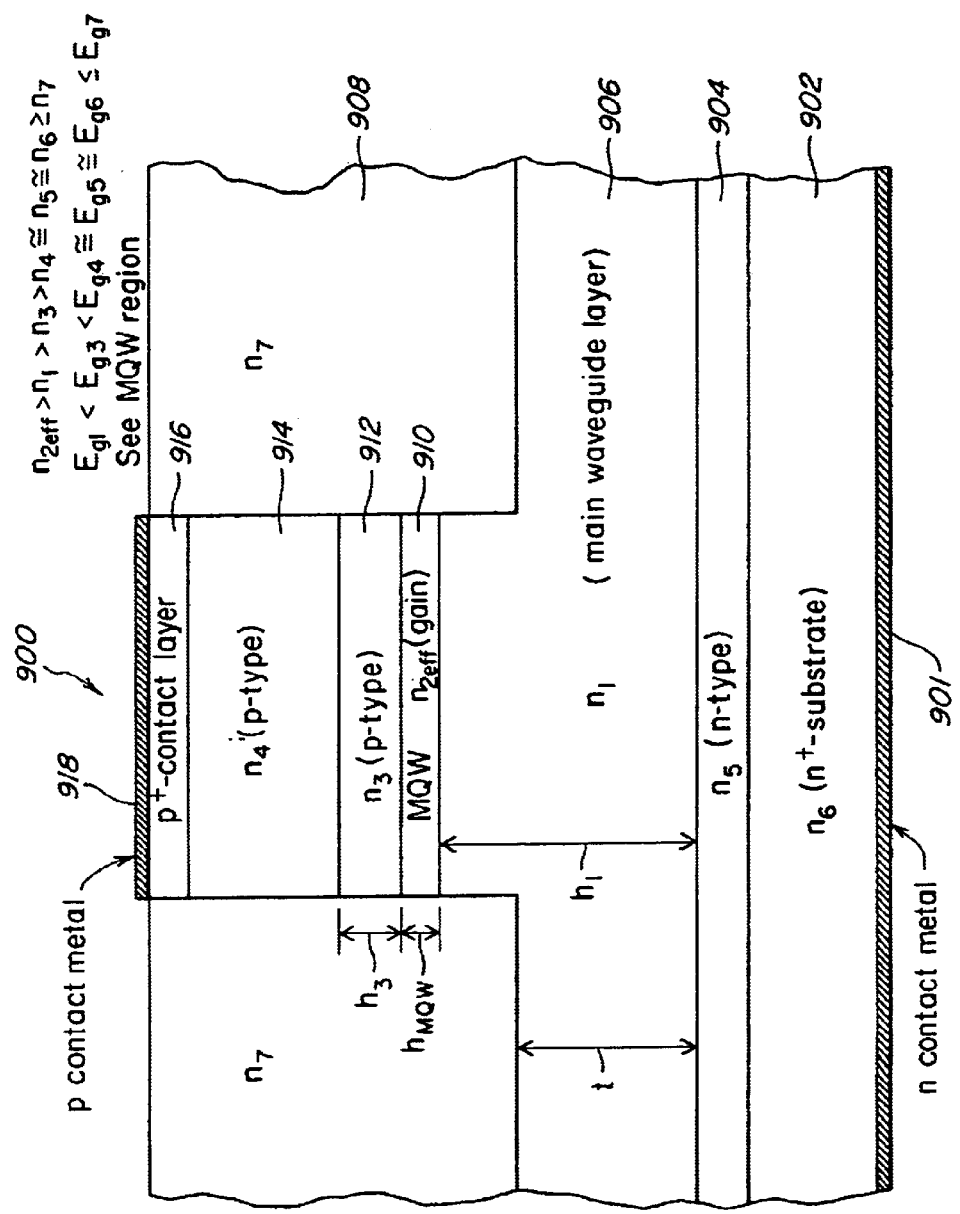
FIG. 9 is a cross section of an alternative exemplary embodiment of a SCOWL device with a MQW gain region near the top of the ridge region.

It becomes necessary to decrease the energy gap (and hence increase the index) of the GaInAsP layer in the lower part of the waveguide (below the MQW region), while using a higher energy gap (lower index) InGaAsP layer in the upper part of the waveguide (above the MQW region), as shown in FIG. 9. The index profile can be adjusted so that no mode is bound to the quantum-well region, but the overlap of the desired mode with the quantum-well region becomes sufficient to provide adequate gain.

FIG. 9 is a cross section of another exemplary embodiment of a SCOWL device 900 in accordance with the invention. The waveguide region now consists of three layers, a top waveguide layer 912, a MQW region 910, and a main waveguide layer 906, respectively. The total height of the waveguiding region H is given by $H = h_1 + h_{MQW} + h_3$. The figure also shows electrical contacts 918 and 901, a heavily doped n-type substrate 902, a lightly doped n-type buffer layer 904, a p-type lightly doped upper cladding layer 914, and a heavily doped p-type contact layer 916. Grooves 908 are etched as in FIG. 4. This region may be filled with regrown semiconductor material or a combination of oxide insulators, or other suitable electrically insulating and/or thermally conducting material, including possibly the solder used to mount and heat sink the device.

This variety of options for filling or not filling the etched grooves apply to all the device structures discussed that have such grooves, including those of FIGS. 4, 9, 10 and 11. Oxide or other insulation is also universally used for these devices to channel the current flow through the structure as desired.

Figure 10:
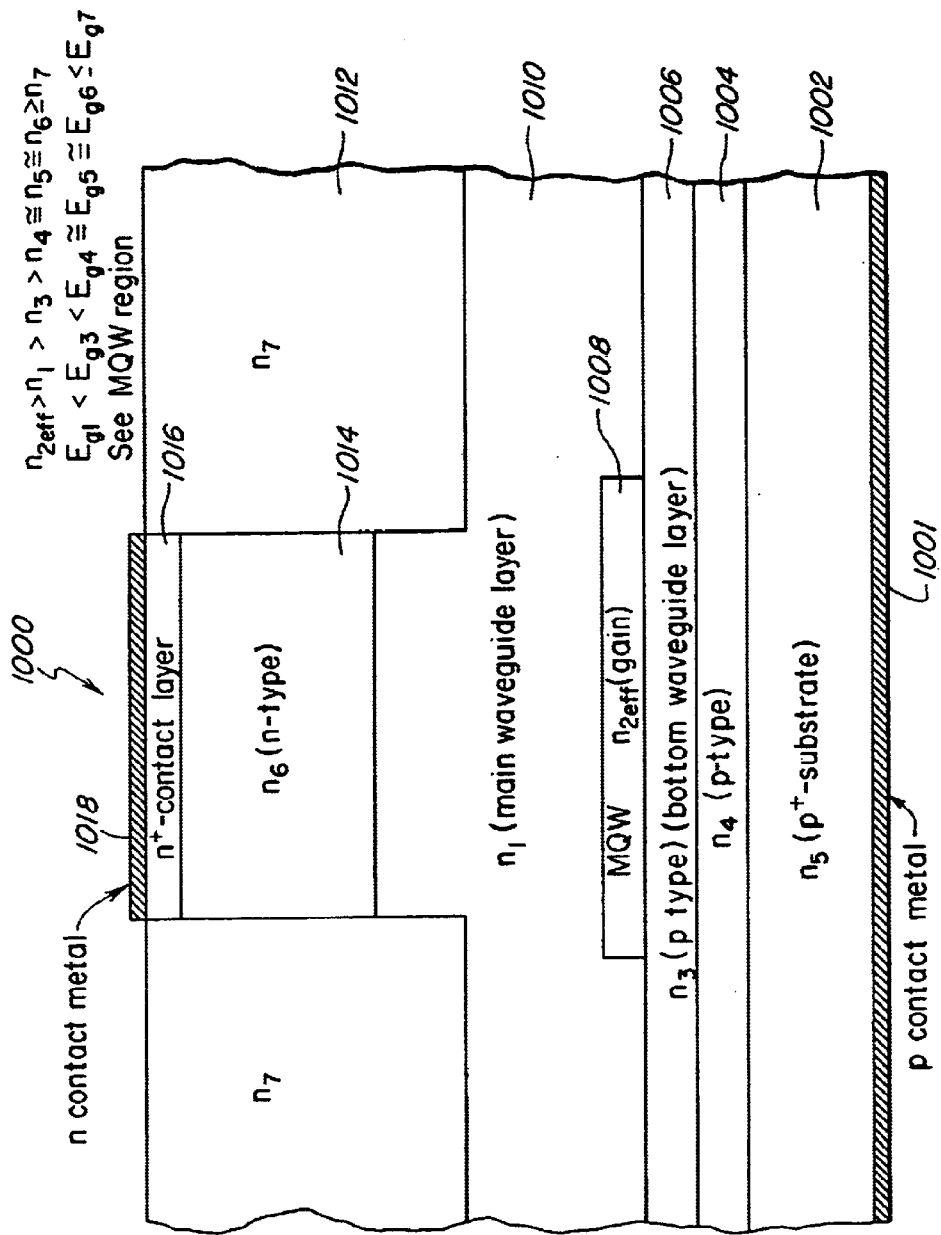
FIG. 10 is a cross section of another alternative exemplary embodiment of a SCOWL device with a MQW gain region near the bottom of the waveguide.

FIG. 10 is a cross section of another exemplary embodiment of a SCOWL device 1000 in accordance with the invention. In FIG. 10, the polarity of the structure has been reversed, with substrate 1002 and buffer layer 1004 being p-type, and the top epitaxial layers including the cladding layer 1014 (this layer would be InP as in FIG. 4 for GaInAsP/InP 1.3-$\mu$m wavelength devices) and a contact layer 1018 being n-type. A multi-quantum-well region 1008 is positioned near the substrate side of a main waveguide layer 1010 to minimize the overlap of the mode with p-type conductivity material. The waveguide region now includes a bottom waveguide layer 1006, which can be omitted for relatively thin waveguide thicknesses, as in FIG. 4, a MQW region 1008, and the main waveguide layer 1010, in which the latter layer is doped lightly n-type.

Figure 11:
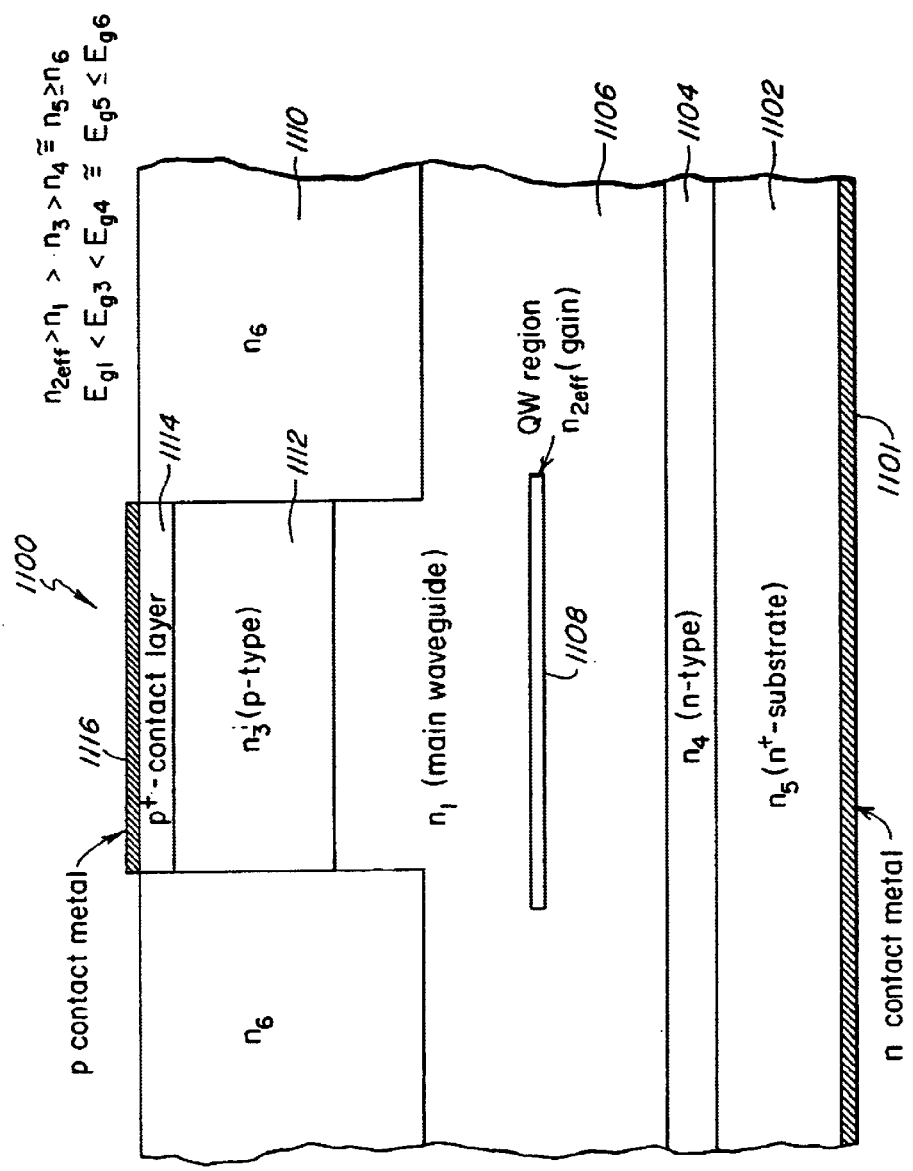
FIG. 11 is a cross section of another alternative exemplary embodiment of a SCOWL device with one or more quantum well gain regions in the center of the waveguide.

The MQW region can be patterned in this structure to provide a pumped region in the center of the structure and unpumped regions out in the slab portion of the structure as in FIG. 4 (not shown in FIG. 10). This structure will require that waste heat produced in the MQW region either flow to the substrate for junction-up mounting and heat sinking or across the waveguide for junction-down mounting and heat sinking. The regions 1012 are etched grooves, as in FIG. 4, that may (or may not) be filled with other materials. Electrical contacts 1018 and 1001 are also shown. In this figure, as in FIG. 11 below, the inequalities for the energy gaps have subscripts consistent with those used for the refractive indices FIG. 11 is a cross section view of yet another exemplary embodiment of a SCOWL device 1100 in accordance with the invention. In FIG. 11, another variation in the design for SCOWL structures is shown in which a quantum-well region 1108 is grown so that it is near the middle of waveguide structure 1106 in the transverse direction. This variation would increase the confinement factor of the desired mode and would require fewer quantum wells (perhaps only one) and, hence, less current to achieve gain. It might require that p-type doping be used in the region of the waveguide above the MQW region in FIG. 11, though it may be possible to inject the necessary holes as minority carriers, especially since this embodiment requires less total current flow.

The various layers include n contact metal 1101, 02 for the $n^+$-substrate 1102, an n-type buffer layer 1104, a p-type upper cladding layer 1112, a $p^+$-contact 1114, a $p^+$-contact metal 1116 and etched grooves 1110 which may (or may not) be filled with other material.

Pulsed operation of a SCOWL laser device in which a single spatial mode of lowest order can be obtained using the structures of FIG. 4.

Figure 12B:
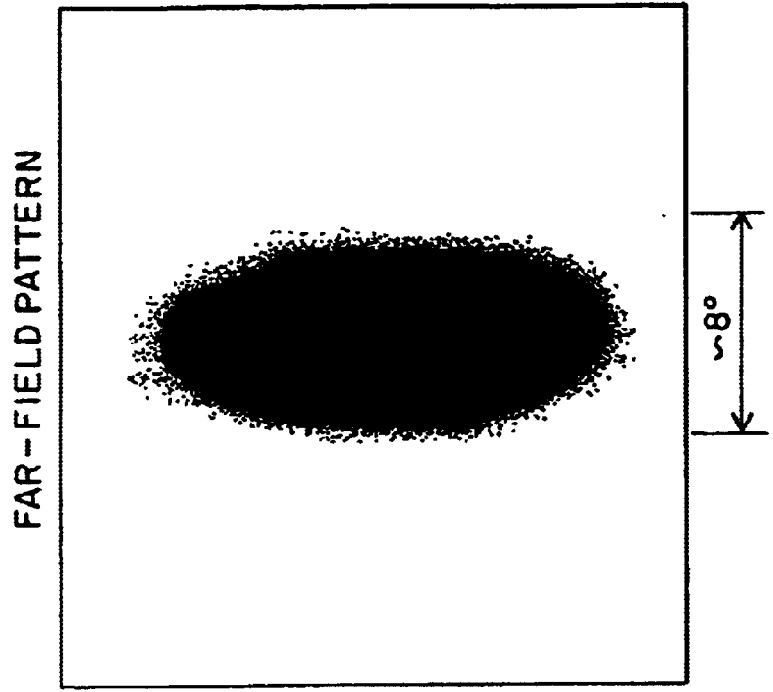
FIGS. 12A and 12B are experimental near- and far-field patterns for pulsed operation of a SCOWL device with the structure of FIG. 4.
Figure 12A:
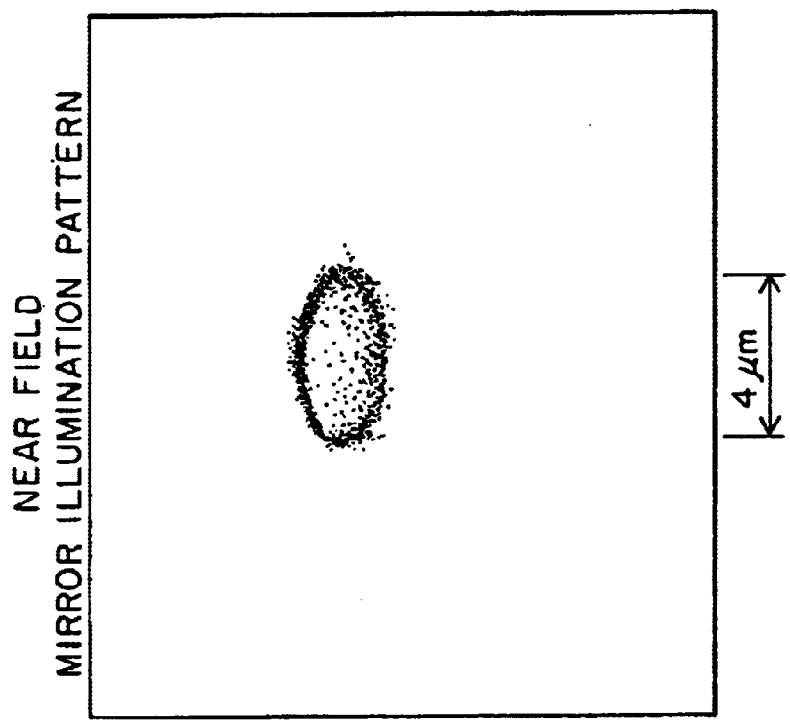

FIGS. 12A and 12B are experimental near- and far-field patterns for pulsed operation of a SCOWL device with the structure of FIG. 4. Essentially identical near- and far-filed patterns were obtained under CW operation. The figures show the mirror-illumination (or near-field) pattern obtained by focusing a magnified image of the output facet onto an infrared vidicon.

Also shown is the corresponding far-field pattern that is obtained by shining the output radiation onto the vidicon located sufficiently far from the emitting device that the far field is obtained.

Figure 13B:
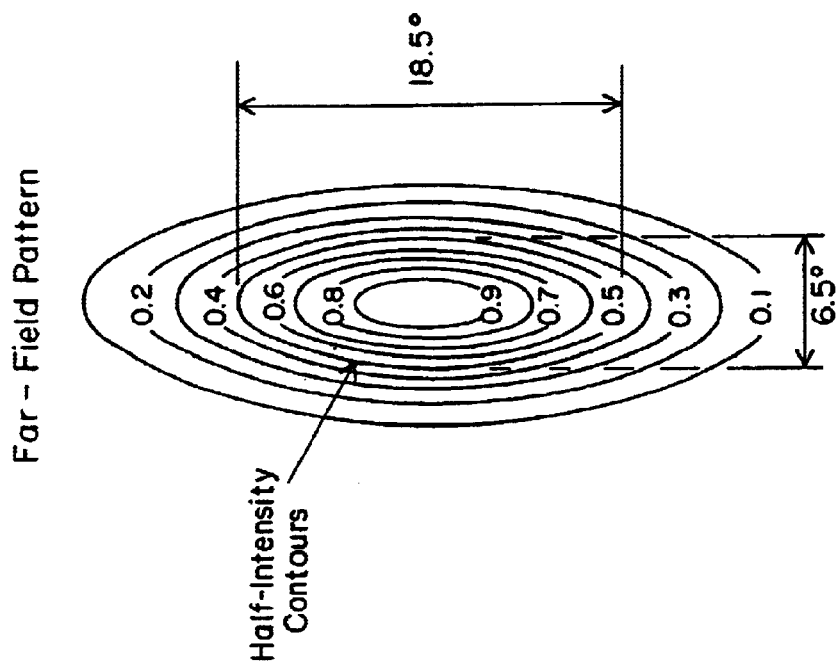
FIGS. 13A and 13B are the theoretical near-field pattern calculated from a computer model, and the theoretical far-field calculated from a two dimensional fast Fourier transform.
Figure 13A:
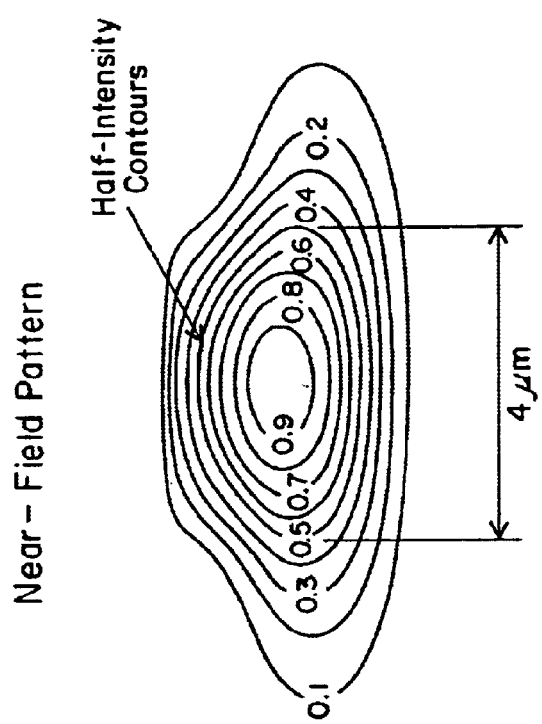

FIG. 13A is the theoretical near-field pattern calculated from a computer model, and FIG. 13B is the theoretical far-field calculated from a two dimensional fast Fourier transform of the near-field pattern of FIG. 13A. The excellent qualitative agreement with the experimental fields confirms that the device was operating in the SCOWL mode and that the output beam is diffraction limited. Pulsed power measurements on devices 1 cm in length show differential quantum efficiency that is approximately 55%. This result implies a loss coefficient for these devices of about 1 cm$^{-1}$.

A numerical overlap of the beam show in FIG. 13A with that of a 6.6-micrometer core-diameter single-mode fiber gives a coupling efficiency to an antireflection-coated butt-coupled fiber of 86%, which is consistent with an aspect ratio of about two. The experimental power coupling observed for the beam shown in FIG. 12 through an uncoated butt-coupled single-mode fiber was 80%.

In FIGS. 14 through 25, other alternative exemplary embodiments that might be used to realize slab-coupled waveguides with gain regions for making single-spatial-mode lasers and amplifiers are shown.

Figure 14:
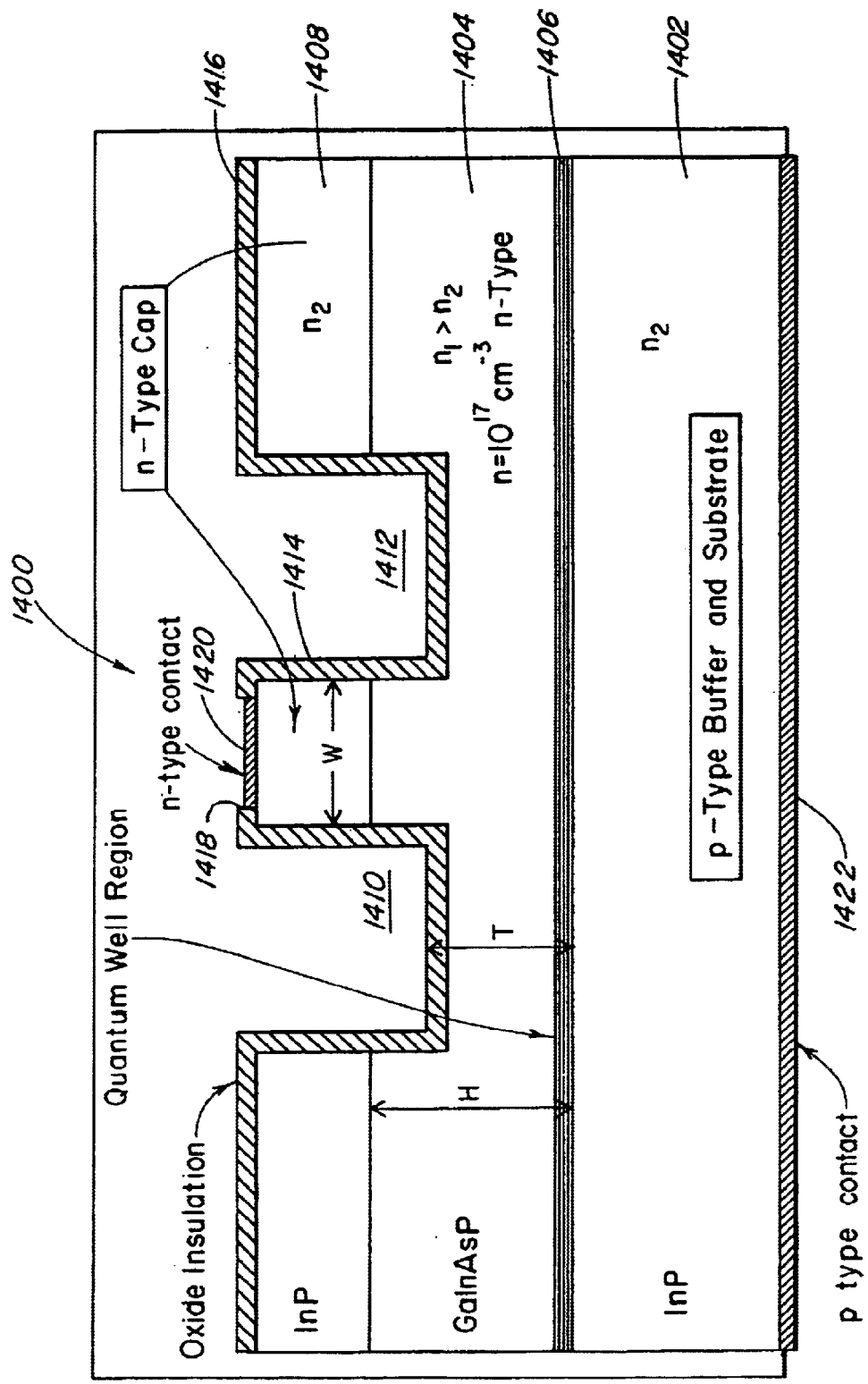
FIG. 14 is a cross section of another alternative exemplary embodiment of a SCOWL device with a quantum well gain region at the bottom of the waveguide region.

FIG. 14 is a cross section of a SCOWL device 1400 using a GaInAsP/InP material system in accordance with the invention. The general design features can be adapted to other semiconductor alloy systems and different wavelengths. Initially, a quantum well region 1406 is fabricated on a p-type buffer and substrate (InP) 1402. Thereafter, a GaInAsP waveguide layer 404 is provided on the quantum well region, and an n-type InP cap layer 1408 is subsequently fabricated. Grooves 1410, 1412 are configured by etching or other conventional manner, thus forming a ridge structure 1414. Finally, a thin oxide insulation layer 1416 covers the entire surface except for an opening area 1418 on the ridge surface in which the top electrical contact 1420 is applied. In this embodiment, the gain region and p-n junction are located in the quantum well region 1406. The structure inverts the carrier type of the regions surrounding the waveguide layer 1404, and isolates the gain region from being etched. The bottom electrical contact 1422 is made to the back of the substrate. In this embodiment the ridge width and depth determine the real index lateral confinement and the ridge width and conductivities in the waveguide and buffer layer and substrate determine current spreading and the lateral gain distribution in the MQW gain region.

Figure 15:
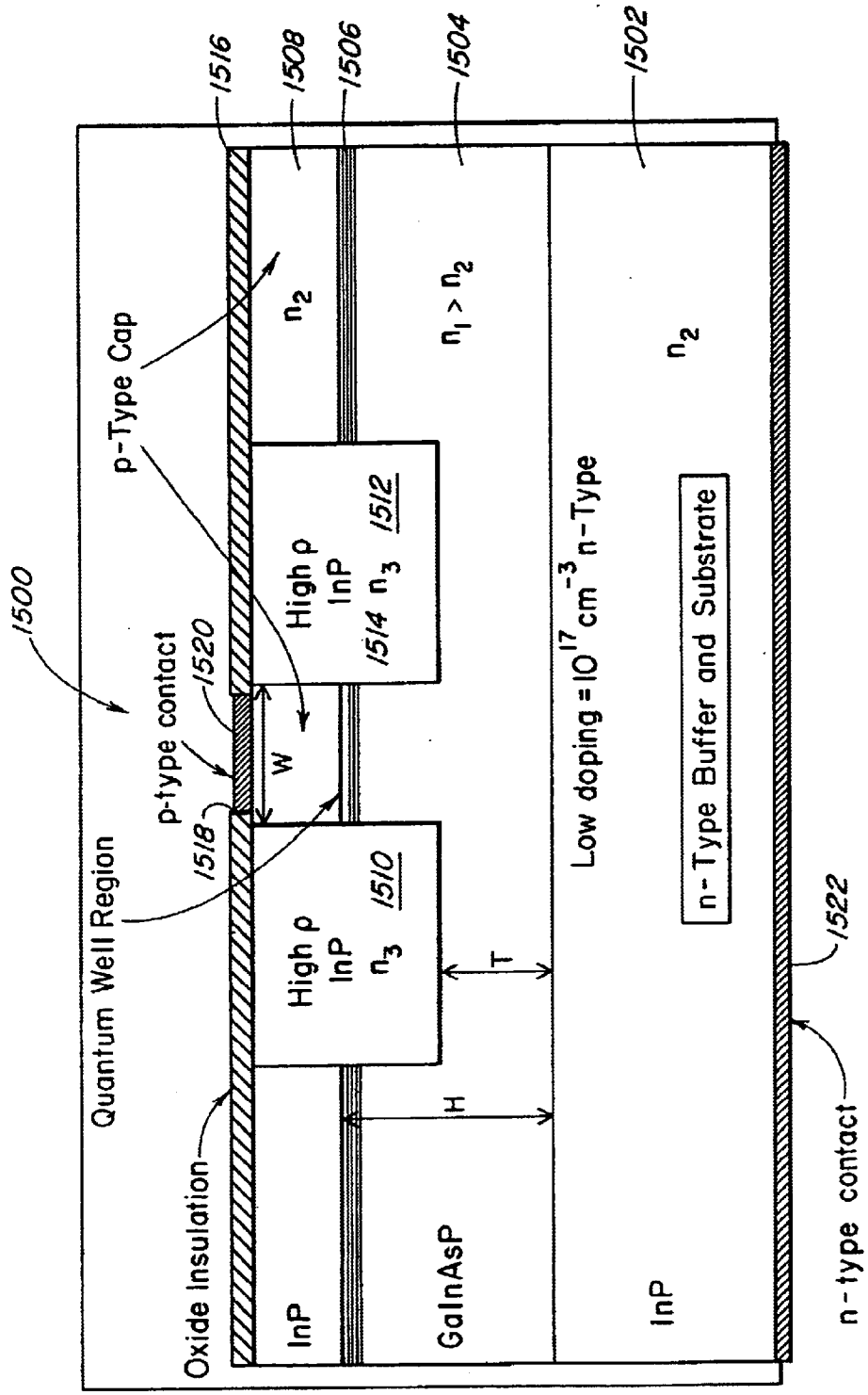
FIG. 15 is a cross section of an alternative exemplary embodiment of a SCOWL device with a quantum well gain region at the top of the ridge region and the grooves next to the ridge filled with high resistivity material.

FIG. 15 is a cross section of another exemplary embodiment of a SCOWL device 1500 using a GaInAsP/InP material system in accordance with the invention. The general design features can be adapted to other semiconductor alloy systems and different wavelengths. Initially, a GaInAsP layer 1504 is provided on a n-type buffer and substrate (InP) 1502. Thereafter, a quantum well region 1506 and a p-type InP cap layer 1508 are subsequently fabricated. Grooves are configured by etching or other conventional manner and filled with high-resistivity InP 1510, 1512, thus forming a ridge structure 1514. The high-resistivity InP 1510, 1512 can be deposited by selective epitaxial growth of Fe-doped InP or other suitable means. Other high resisitity materials with dielectric constants less than that of the waveguide region could be employed instead of the high-resistivity InP. Finally, a thin oxide insulation layer 1516 covers the entire surface except for an opening area 1518 on the ridge surface in which the top electrical contact 1520 is applied. The bottom electrical contact 1522 is made to the back of the substrate.

Figure 16:
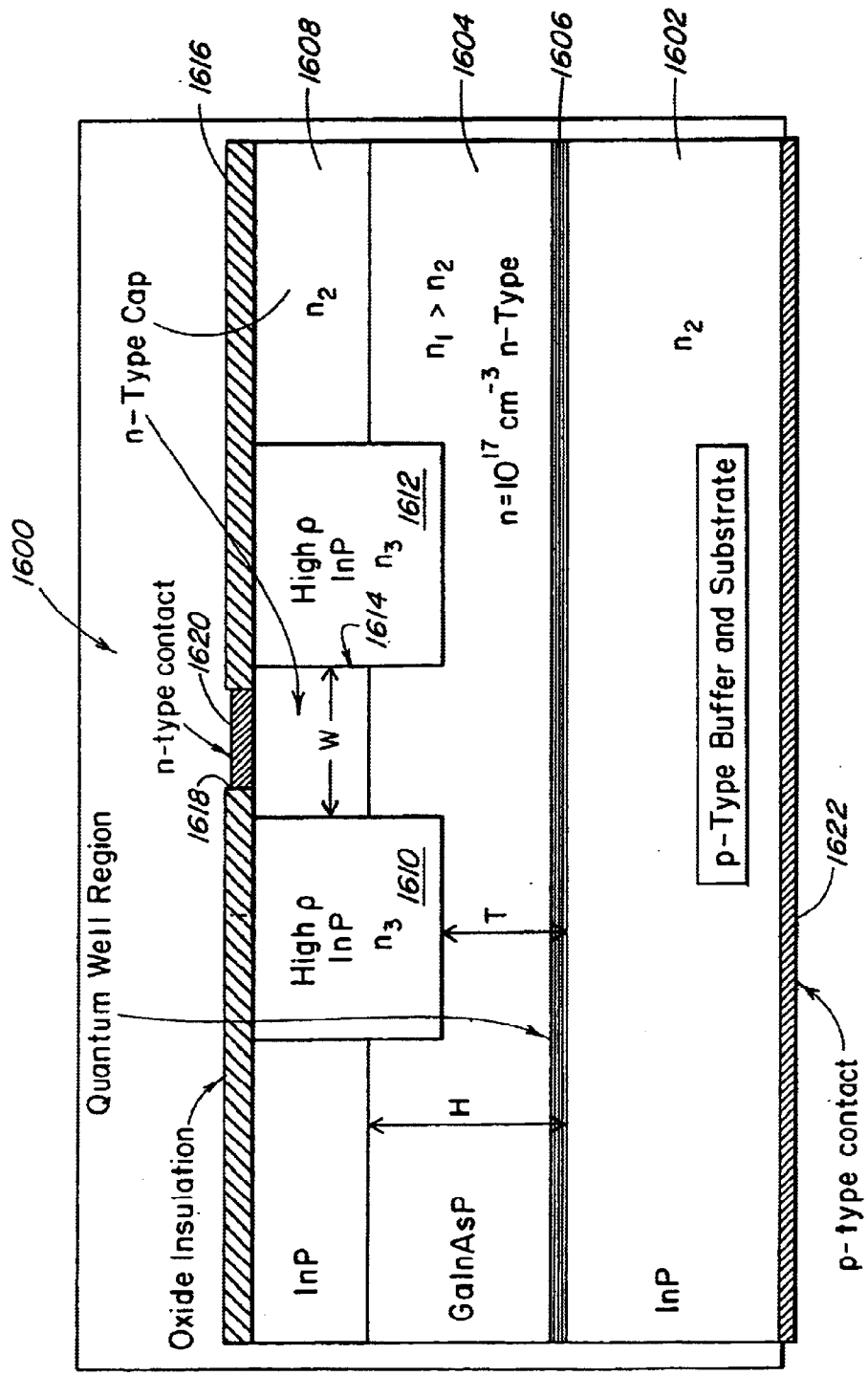
FIG. 16 is a cross section of an alternative exemplary embodiment of a SCOWL device with a quantum well gain region at the bottom of the waveguide region and the grooves next to the ridge filled with high resistivity material.

FIG. 16 is a cross section of another exemplary embodiment of a SCOWL device 1600 using a GaInAsP/InP material system in accordance with the invention. The general design features can be adapted to other semiconductor alloy systems and different wavelengths. Initially, a quantum well region 1606 is fabricated on a p-type buffer and substrate (InP) 1602. Thereafter, a GaInAsP waveguide layer 1604 is provided on the quantum well region, and an n-type InP cap layer 1608 is subsequently fabricated. Grooves are configured by etching or other conventional manner and filled with high-resistivity InP 1610, 1612, thus forming a ridge structure 1614. The high-resistivity InP 1610, 1612 can be deposited by selective epitaxial growth of Fe-doped InP or other suitable means. Other high resistivity materials with dielectric constants less than that of the waveguide region could be employed instead of the high-resistivity InP. Finally, a thin oxide insulation layer 1116 covers the entire surface except for an opening area 1618 on the ridge surface in which the top electrical contact 1620 is applied. In this embodiment, the gain region and p-n junction are located in the quantum well region 1606. The structure inverts the carrier type of the regions surrounding the waveguide layer 1604, and isolates the gain region from being etched. The bottom electrical contact 1622 is made to the back of the substrate.

Figure 17:
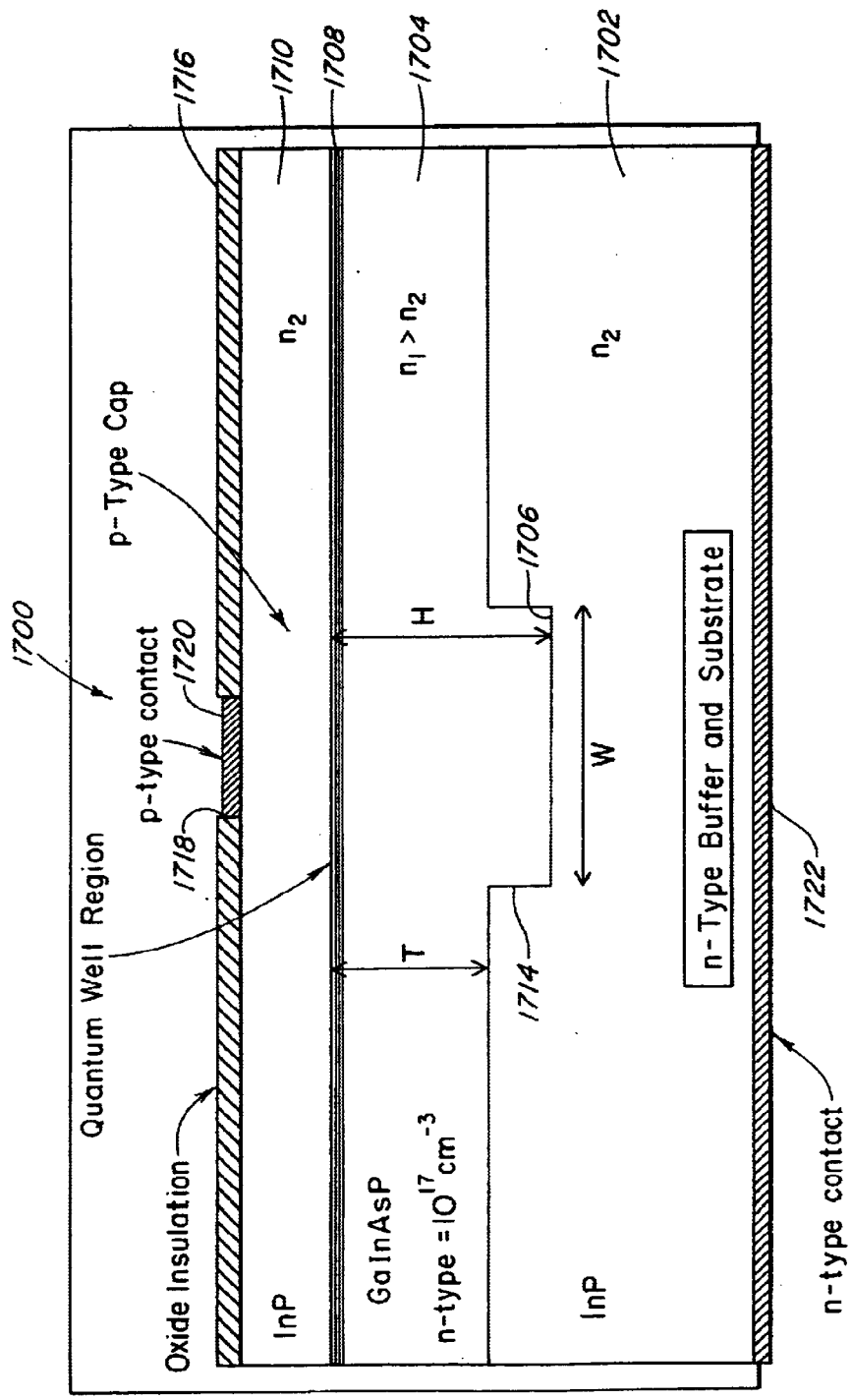
FIG. 17 is a cross section of an alternative exemplary embodiment of a SCOWL device with a ridge at the bottom of the waveguide region and a quantum well gain region at the top of the waveguide region.

FIG. 17 is a cross section of an alternative exemplary embodiment of a SCOWL device 1700 using the GaInAsP/InP material system in accordance with the invention. The general design features can be adapted to other semiconductor alloy systems and different wavelengths. The lightly doped n-type InGaAsP waveguide region 1704 is formed by regrowth over an InP n-type buffer layer and substrate 1702 that has been etched to produce a groove 1706. In this case the ridge 1714 is formed by the regrowth in the etched groove. Alternatively, the groove could be mass transported to form a smoother profile before regrowth and perhaps a better shaped bound mode could be obtained as discussed in reference to FIG. 3. Immediately above the waveguide, a thin region 1708, including one or more quantum wells and comprising the active gain region, is grown. The top InP cladding layer 1710 that is p-type is then grown. Finally, a thin oxide insulation layer 1716 covers the entire surface except for an opening area 1718 on the ridge surface in which the top electrical contact 1720 is applied. The bottom electrical contact 1722 is made to the back of the substrate. In this embodiment, the gain region and p-n junction are located in the quantum well region 1706 and current is passed from the bottom to top contact. The etched (or etched and transported) groove 1706 in which the inverted ridge 1714 is grown has a depth and width that, together with the refractive indices of the various regions, determine the modal properties of the waveguide. The top contact width and conductivities of the top cladding layer and the layers under the quantum-well gain region determine current spreading and the lateral gain distribution in the quantum-well region. Techniques such as proton bombardment or ion-implantation on the upper cladding layer can also be used to control lateral current spreading and therefore the lateral gain distribution. These techniques are also applicable to many of the other SCOWL embodiments illustrated herein.

Figure 18:
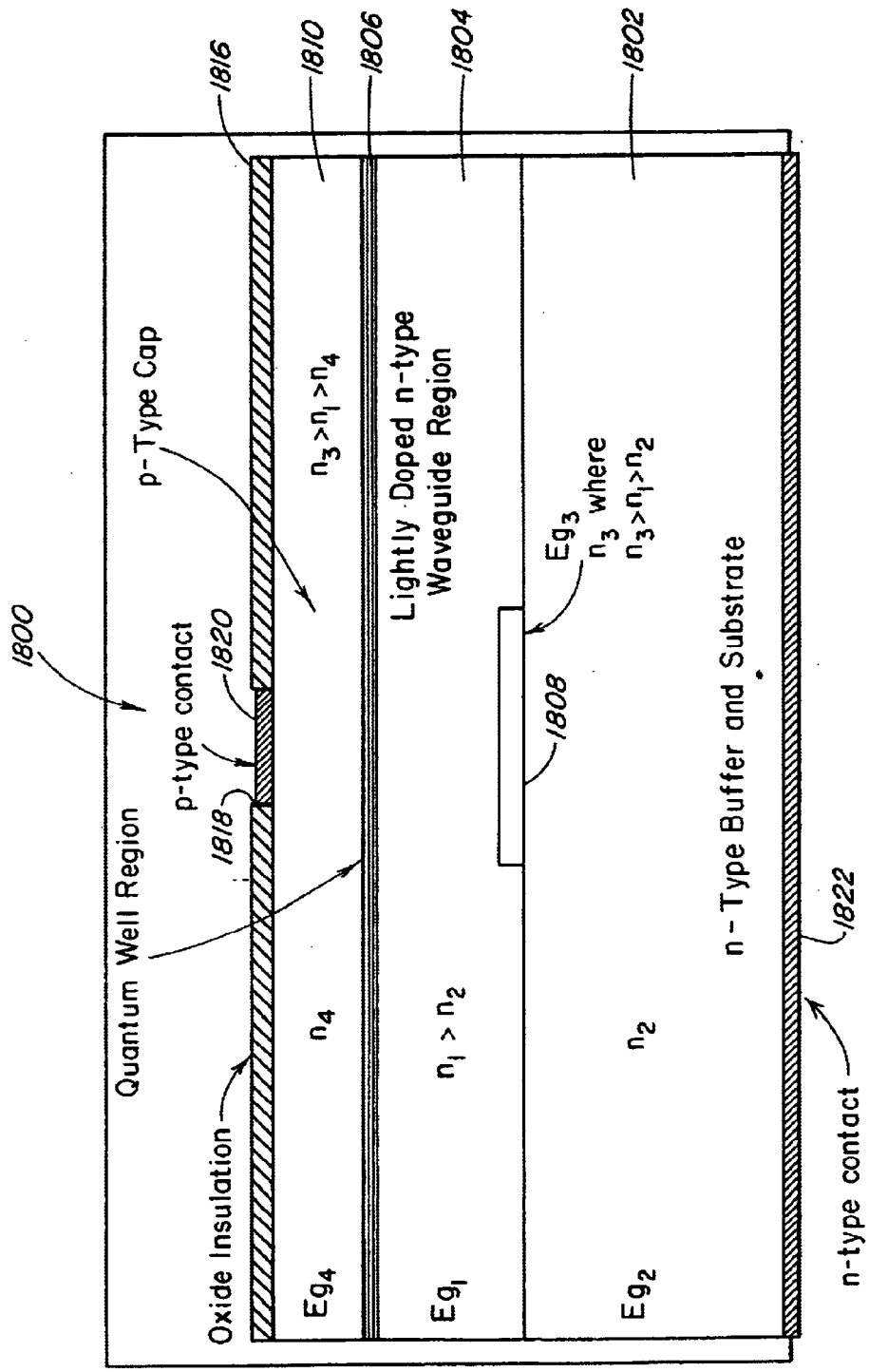
FIG. 18 is a cross section of an alternative exemplary embodiment of a SCOWL device with a raised or heightened region of higher index at the bottom of the waveguide region and a quantum well gain region at the top of the waveguide region.

FIG. 18 is a cross section of an alternative exemplary embodiment of a SCOWL device 1800. The general design features can be adapted to any semiconductor alloy systems and different wavelengths. In this embodiment an n-type buffer layer of is grown on an n-type substrate. For simplicity the buffer layer and substrate are shown as one layer in the figures. In practice the buffer layer can have a different bandgap and index than the substrate. If the buffer layer and substrate have the same bandgap, it is possible to omit the buffer layer and the substrate takes the place of both the substrate and buffer layer. Lateral index confinement is provided by growing and selectively etching material of bandgap $Eg_3$ and real index $n_3$ 1808 on the n-type buffer layer 1802 of bandgap $Eg_2$ and real index $n_2$, where $Eg_3 < Eg_2$ and $n_3 > n_2$. Immediately above and on the sides of material of bandgap $Eg_3$ and real index $n_3$ 1808, the main waveguide layer 1804 of material of bandgap $Eg_1$ and real index $n_1$, where $Eg_3 < Eg1 < Eg_2$ and $n_3 > n_1 > n_2$. Thereafter, a quantum well region 1806 and a p-type InP cap layer 1810 of $Eg_4$ and real index $n_4$, where $Eg_3 < Eg1 < Eg_4$ and $n_3 > n_1 > n_4$ are grown. In many cases $Eg_4$ will equal $Eg_2$ and $n_4$ will be approximately equal to $n_2$. In all of these embodiments, the thin quantum well region generally has the highest real effective index. Finally, a thin oxide insulation layer 1816 covers the entire surface except for an open area 1818 above the buried layer material 1808 in which the top electrical contact 1820 is applied. The bottom electrical contact 1822 is made to the back of the substrate. In this embodiment the width and thickness of material 1808 provides the lateral index confinement and the top contact width and conductivities of the top cladding layer and the layers under the quantum well gain region determine current spreading and the lateral gain distribution in the quantum well gain region.

Figure 19:
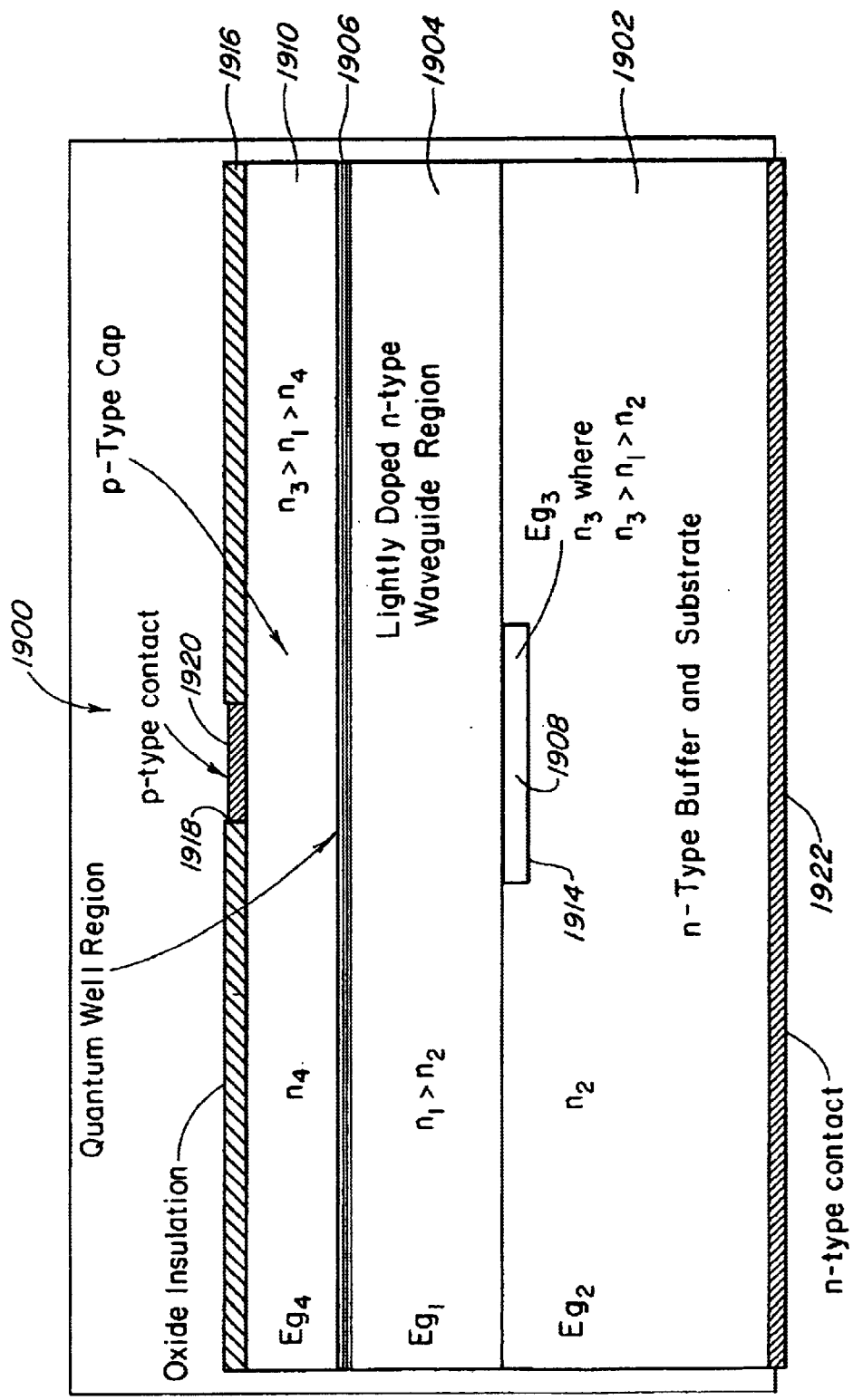
FIG. 19 is a cross section of an alternative exemplary embodiment of a SCOWL device with region of higher index depressed in the substrate under the bottom of the waveguide region and a quantum well gain region at the top of the waveguide region.

FIG. 19 is a cross section of an alternative exemplary embodiment of a SCOWL device 1900. The general design features can be adapted to any semiconductor alloy systems and different wavelengths. In this embodiment lateral index confinement is provided by selectively etching a groove in the n-type buffer layer 1902 of bandgap $Eg_2$ and real index $n_2$, which has been grown on an n-type substrate, and selectively growing in the etched groove 1914 material 1908 of bandgap $Eg_3$ and real index $n_3$, where $Eg_3 < Eg_2$ and $n_3 > n_2$. For simplicity, the n-type buffer layer and substrate are shown as one layer. Immediately above the n-type buffer layer 1902 and selectively grown material 1908, the main waveguide layer 1904 of material of bandgap $Eg_1$ and real index $n_1$, where $Eg_3 < Eg1 < Eg_2$ and $n_3 > n_1 > n_2$, is grown. Thereafter, a quantum well region 1906 and a p-type cap layer 1910 of $Eg_4$ and real index $n_4$, where $Eg_3 < Eg1 < Eg_4$ and $n_3 > n_1 > n_4$ are grown. Finally, a thin oxide insulation layer 1916 covers the entire surface except for an open area 1918 above the buried layer material 1908 in which the top electrical contact 1920 is applied. The bottom electrical contact 1922 is made to the back of the substrate. In this embodiment the width and thickness of the material 1908 provides the lateral index confinement and the top contact width and conductivities of the top cladding layer and the layers under the quantum-well gain region determine current spreading and the lateral gain distribution in the quantum-well gain region.

Figure 20:
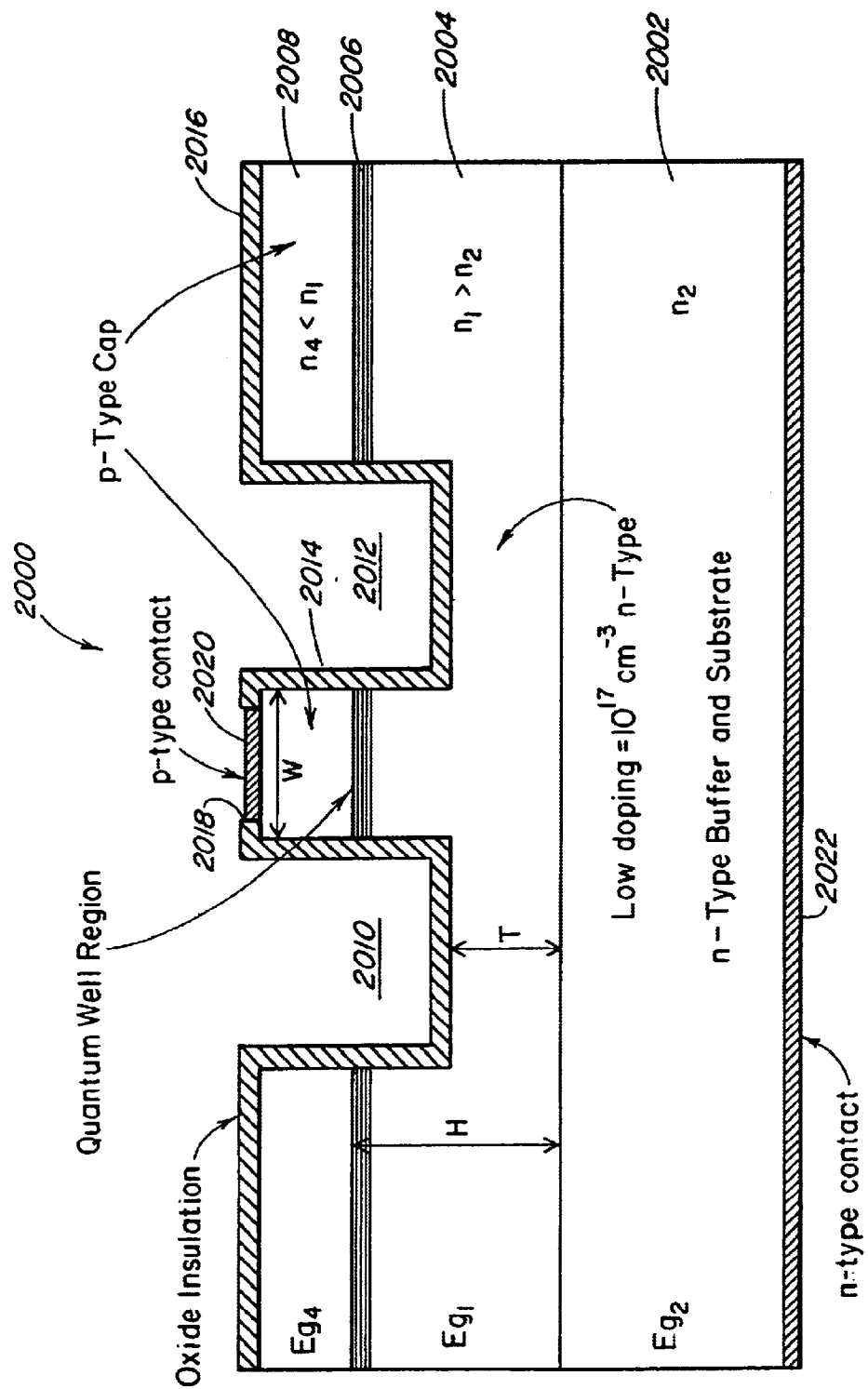
FIG. 20 is a cross section of an alternative exemplary embodiment of a SCOWL device with an etched ridge and a quantum well gain region at the top of tile ridge region.

FIG. 20 is a cross section of another exemplary embodiment of a SCOWL device 2000, whose general design features can be adapted to any semiconductor alloy systems and different wavelengths. Initially, an n-type buffer 2002 of material with bandgap $Eg_2$ and real index $n_2$ is grow on an n-type substrate followed by a waveguide layer 2004 of material of bandgap $Eg_1$ and real index $n_1$, where $Eg1 < Eg_2$ and $n_3 > n_1 > n_2$. For simplicity the buffer layer and substrate are shown as one layer in the figures. In practice the buffer layer can have a different bandgap and index than the substrate. Thereafter, a quantum well region 2006 and a p-type cap layer 2008 of material of bandgap $Eg_4$ and real index $n_1$, where $Eg1 < Eg_4$ and $n_1 > n_4$ are subsequently fabricated. Grooves 2010, 2012 are configured by etching or other conventional manner, thus forming a ridge structure 2014. Finally, a thin oxide insulation layer 2016 covers the entire surface except for an opening area 2018 on the ridge surface in which the top electrical contact 2020 is applied. The bottom electrical contact 2022 is made to the back of the substrate.

Figure 21:
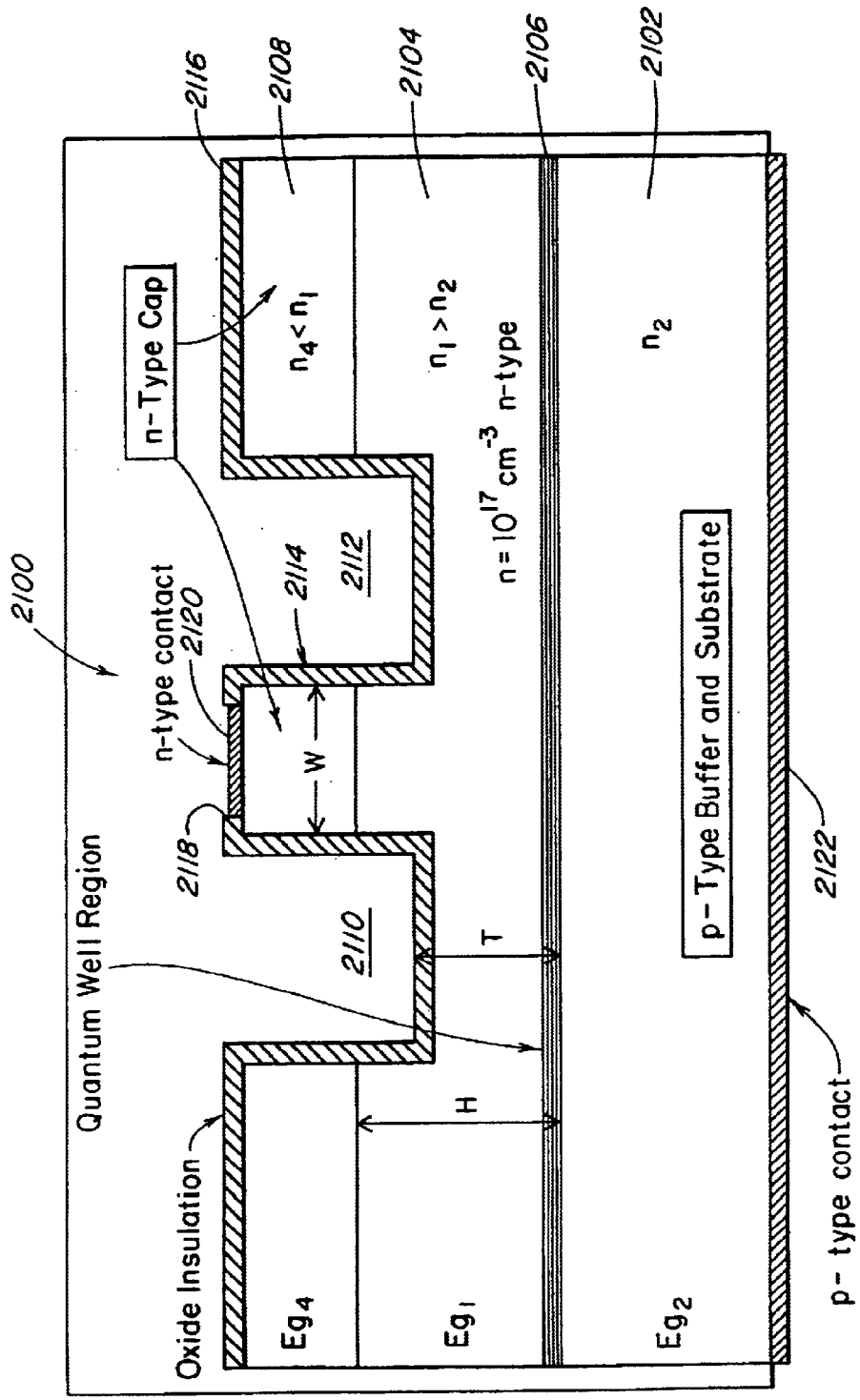
FIG. 21 is a cross section of another alternative exemplary embodiment of a SCOWL device with an etched ridge region and a quantum well gain region at the bottom of the waveguide region.

FIG. 21 is a cross section of another exemplary embodiment of a SCOWL device 2100, whose general design features can be adapted to any semiconductor alloy systems and different wavelengths. Initially, a p-type buffer 2102 of material with bandgap $Eg_2$ and real index $n_2$ is grow on an p-type substrate followed by an unintentional doped quantum well region 2106 and a lightly doped n-type waveguide layer 2104 of material of bandgap $Eg_1$ and real index $n_1$, where $Eg1 < Eg_2$ and $n_1 > n_2$. For simplicity the buffer layer and substrate are shown as one layer in the figures. In practice the buffer layer can have a different bandgap and index than the substrate. Thereafter, an n-type cap layer 2108 of material of bandgap $Eg_4$ and real index $n_1$, where $Eg1 < Eg_4$ and $n_1 > n_4$ are subsequently fabricated. Grooves 2110, 2112 are configured by etching or other conventional manner, thus forming a ridge structure 2114. Finally, a thin oxide insulation layer 2116 covers the entire surface except for an opening area 2118 on the ridge surface in which the top electrical contact 2120 is applied. In this embodiment, the gain region and p-n junction are located in the quantum well region 2106. Compared to FIG. 20, the structure inverts the carrier type of the regions surrounding the waveguide layer 2104, and isolates the gain region from being etched. The bottom electrical contact 2122 is made to the back of the substrate. In this embodiment the ridge width and depth determine the real index lateral confinement and the ridge width and conductivities in the waveguide and buffer layer and substrate determine current spreading and the lateral gain distribution in the quantum-well gain region.

Figure 22:
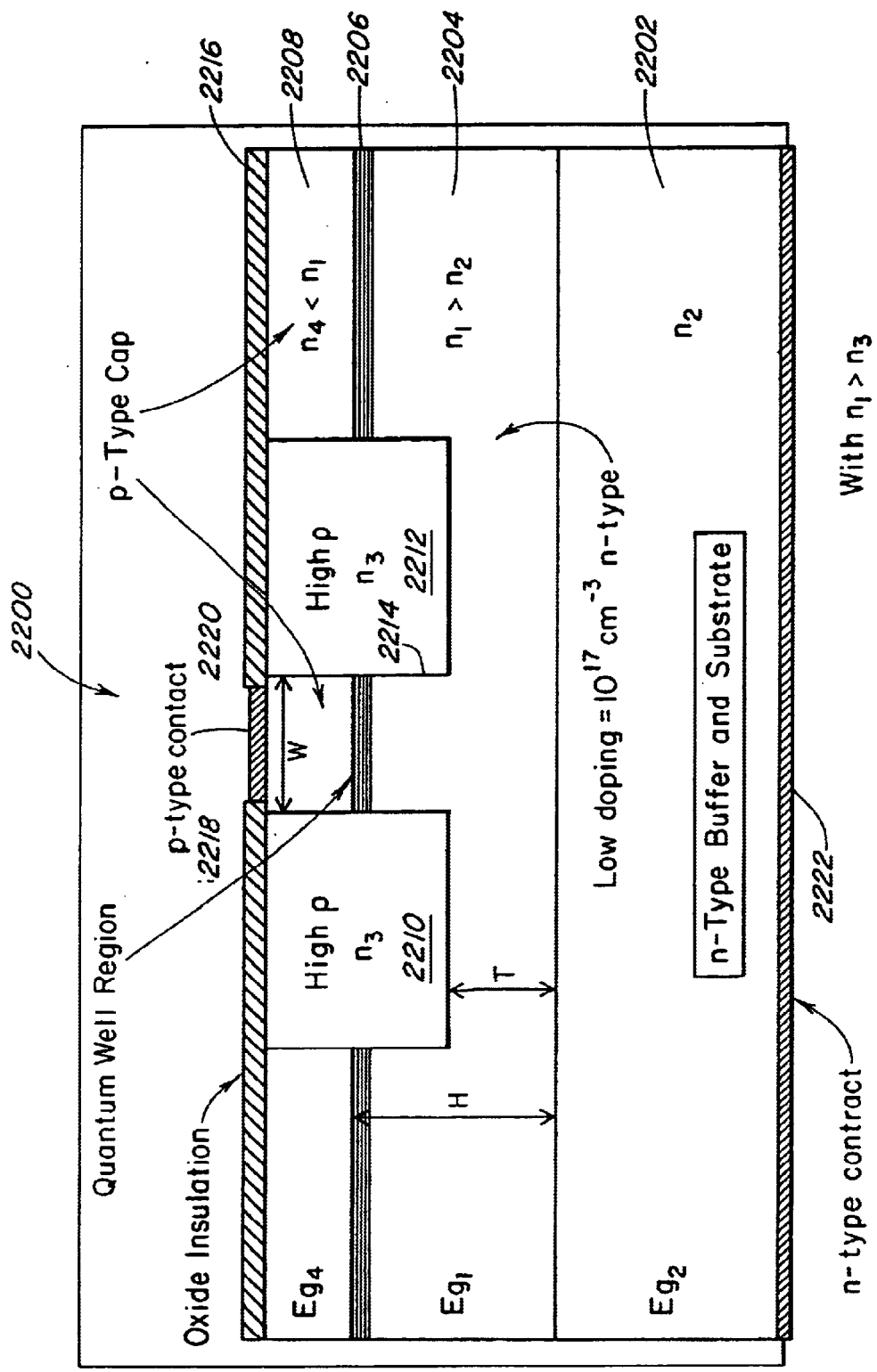
FIG. 22 is a cross section of an alternative exemplary embodiment of a SCOWL device with a quantum well gain region at the top of the ridge region and the groove regions next to the ridge filled with high resistivity material.

FIG. 22 is a cross section of another exemplary embodiment of a SCOWL device 2200, whose general design features can be adapted to any semiconductor alloy systems and different wavelengths. Initially, an n-type buffer 2202 of material with bandgap $Eg_2$ and real index $n_2$ is grown on an n-type substrate followed by a waveguide layer 2204 of material of bandgap $Eg_1$ and real index $n_1$, where $Eg1 < Eg_2$ and $n_1 > n_2$. For simplicity the buffer layer and substrate are shown as one layer in the figures. In practice the buffer layer can have a different bandgap and index than the substrate. Thereafter, a quantum well region 2206 and a p-type cap layer 2208 of material of bandgap $Eg_4$ and real index $n_1$, where $Eg1 < Eg_4$ and $n_1 > n_4$ are subsequently fabricated. Grooves are configured by etching or other conventional manner, thus forming a ridge structure 2214. The grooves are then filled with high-resistivity material 2210,2212 of index $n_3 < n_1$. Finally, a thin oxide insulation layer 2216 covers the entire surface except for an opening area 2218 on the ridge surface in which the top electrical contact 2220 is applied. The bottom electrical contact 2222 is made to the back of the substrate.

Figure 23:
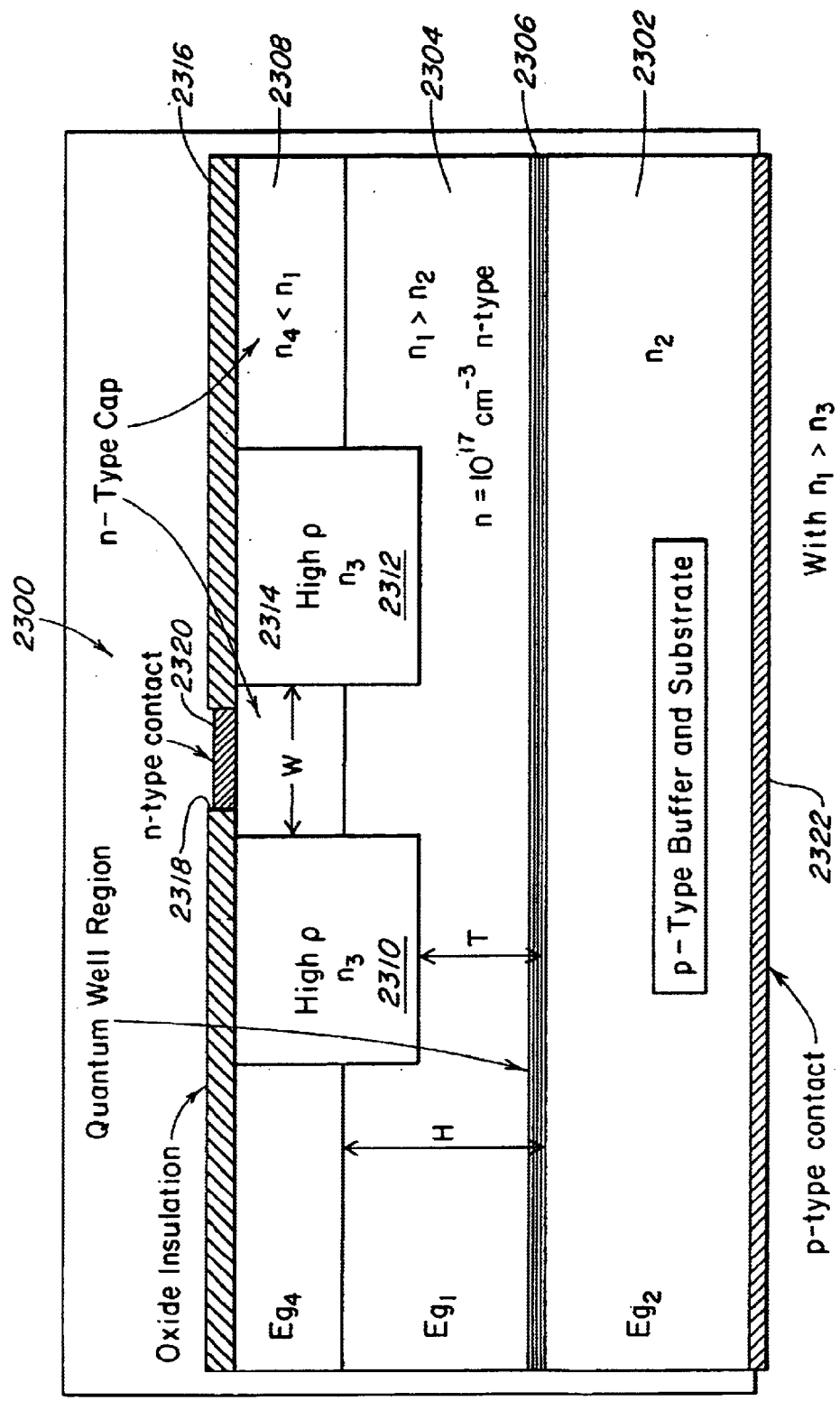
FIG. 23 is a cross section of an alternative exemplary embodiment of a SCOWL device with a quantum well gain region at the bottom of the waveguide region and the groove regions next to the ridge filled with high resistivity material.
Figure 24:
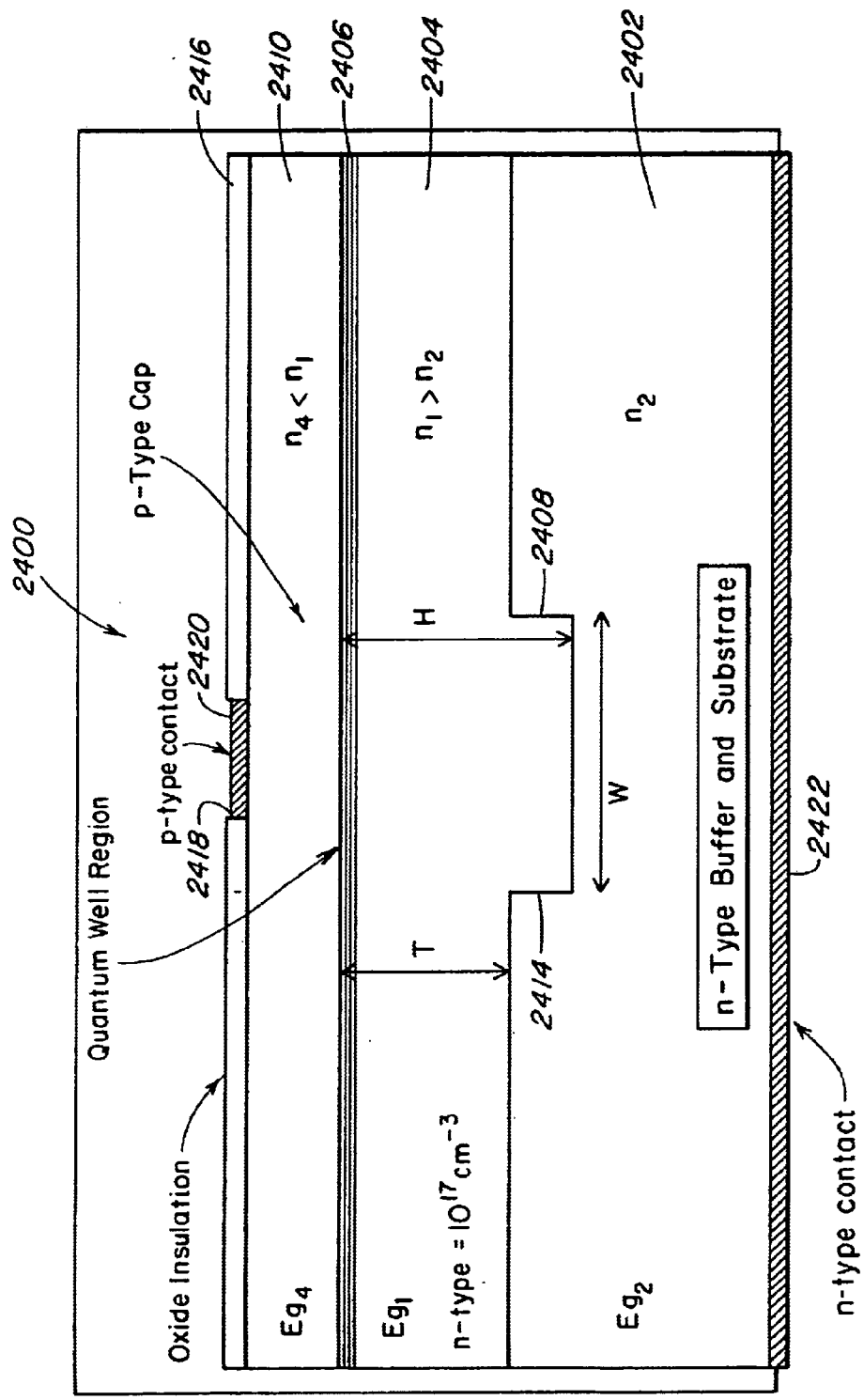
FIG. 24 is a cross section of an alternative exemplary embodiment of a SCOWL device with the ridge region at the bottom of the waveguide region and a quantum well gain region at the top of the waveguide region.

FIG. 23 is a cross section of another exemplary embodiment of a SCOWL device 2300, whose general design features can be adapted to any semiconductor alloy systems and different wavelengths. Initially, a p-type buffer 2302 of material with bandgap $Eg_2$ and real index $n_2$ is grow on an p-type substrate. For simplicity the buffer layer and substrate are shown as one layer in the figures. In practice the buffer layer can have a different bandgap and index than the substrate. Thereafter, a nominally undoped quantum well region 2306, followed by a lightly n-doped waveguide layer 2304 of material of bandgap $Eg_1$ and real index $n_1$, where $Eg1 < Eg_2$ and $n_1 > n_2$ and a n-type cap layer 2308 of material of bandgap $Eg_4$ and real index $n_1$, where $Eg1 < Eg_4$ and $n_1 > n_4$ are subsequently fabricated. Grooves are configured by etching or other conventional manner, thus forming a ridge structure 2314. The grooves are then filled with high-resistivity material 2310, 2312 of index $n_3 < n_1$. Finally, a thin oxide insulation layer 2316 covers the entire surface except for an opening area 2318 on the ridge surface in which the top electrical contact 2320 is applied. The bottom electrical contact 2322 is made to the back of the substrate. In this embodiment the quantum well region is not etched. The ridge width and depth determines the lateral index confinement and ridge width and conductivities of the waveguide layer and the layers under the quantum-well gain region determine current spreading and the lateral gain distribution in the quantum-well gain region FIG. 24 is a cross section of another exemplary embodiment of a SCOWL device 2400, whose general design features can be adapted to any semiconductor alloy systems and different wavelengths. Initially an n-type buffer layer with bandgap $Eg_2$ and real index $n_2$ is grown on an n-type substrate. For simplicity the buffer layer and substrate are shown as one layer in the figures. In practice the buffer layer can have a different bandgap and index than the substrate of A groove 2408 is etched in the n-type buffer layer and the lightly doped n-type waveguide region 2404 of material of bandgap $Eg_1$ and real index $n_1$, where $Eg1<Eg_2$ and $n_1>n_2$ is formed by regrowth over an n-type buffer layer 2402. In this case the ridge 2414 is formed by the regrowth in the etched groove 2408. Alternatively, the groove in some material systems could be mass transported to form a smoother profile and perhaps a better shaped bound mode as shown in FIG.3. Immediately above the waveguide, a thin region 2406, including one or more quantum wells and comprising the active gain region, is grown. The top p-type cladding layer 2410 of material of bandgap $Eg_4$ and real index $n_4$, where $Eg1<Eg_4$ and $n_1>n_4$ is then grown. The etched (or etched and transported) groove 2408, 2414 has a depth and width that, together with the refractive indices of the various regions, determine the modal properties of the waveguide. Finally, a thin oxide insulation layer 2416 covers the entire surface except for an opening area 2418 on the ridge surface in which the top electrical contact 2420 is applied. The bottom electrical contact 2422 is made to the back of the substrate. In this embodiment the top contact width and conductivities of the top cladding layer and the layers under the quantum-well gain region determine current spreading and the lateral gain distribution in the quantum-well gain region.

Figure 25:
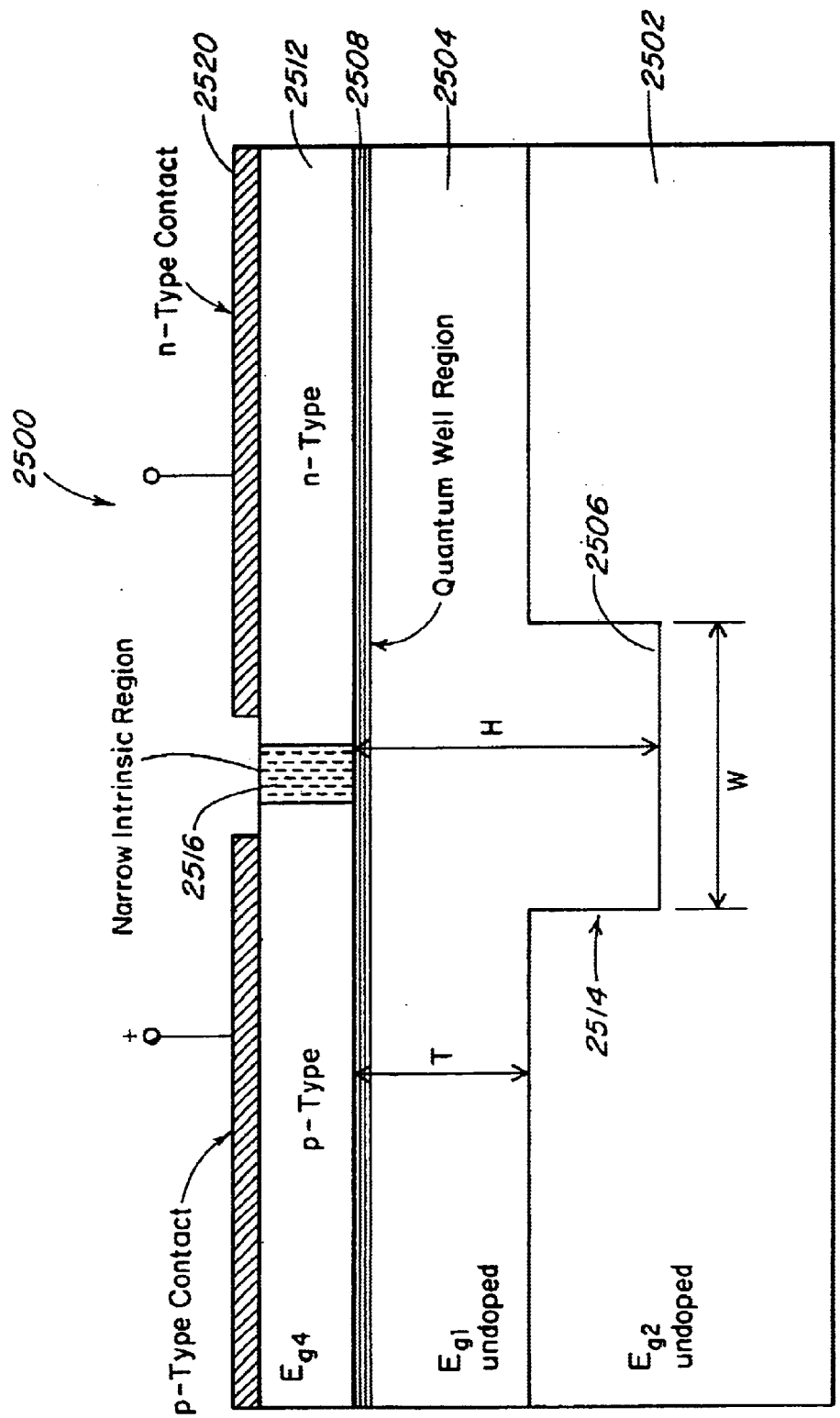
FIG. 25 is a cross section of an alternative exemplary embodiment of a SCOWL device with the ridge region at the bottom of the waveguide region, a quantum well gain region at the top of the waveguide region and lateral injection into the quantum well region above the ridge region.

FIG. 25 is a cross section of exemplary embodiment of a SCOWL device 2500, whose general design features can be adapted to any semiconductor alloy systems and different wavelengths. It differs from the embodiment shown in FIG. 3 in that the upper and lower cladding can have different bandgaps and indices. Initially an undoped buffer layer with bandgap $Eg_2$ and real index $n_2$ is grown on a high-resistivity or lightly-doped substrate. For simplicity the buffer layer 2502 and substrate are shown as one layer in the figures. In practice the buffer layer can have a different bandgap and index than the substrate. A groove 2506 is etched in the buffer layer and the high-resistivity or undoped waveguide region 2504 of material of bandgap $Eg_1$ and real index $n_1$, where $Eg1<Eg_2$ and $n_1>n_2$ is formed by regrowth over the buffer layer 2502. In this case the ridge 2514 is formed by the regrowth in the etched groove 2506 . Alternatively, the groove in some material systems could be mass transported to form a smoother profile and perhaps a better shaped bound mode as shown in FIG.3. Immediately above the waveguide, a thin unintentionally region 2508, including one or more quantum wells and comprising the active gain region, is grown. The top cladding layer 2512 of material of bandgap $Eg_4$ and real index $n_4$, where $Eg1<Eg_4$ and $n_1>n_4$ is then grown. The etched (or etched and transported) groove 2506 in which the ridge 2514 is grown has a depth and width that, together with the refractive indices of the various regions, determine the modal properties of the waveguide. The lateral p-i-n junction used to laterally inject carriers in the quantum well gain region positioned over the ridge can be fabricated in various ways. For example, if the top cladding is grown moderately n-type, the p-side can be made by selective implantation or diffusion. Alternately, if the top cladding is grown nominally undoped, both the p- and n-sides can be made by selective ion implantation or diffusion. In either case it is probably necessary to form a thin high-resistivity layer 2516 between the n- and p-type regions in the top cladding. This can be accomplished by selective ion implantation or proton bombardment. To complete the structure, an oxide or other dielectric applied to the top surface, p- and n-contact openings made in the dielectric and p- and n-contacts applied. As previously mentioned, the general device features of the SCOWL embodiments illustrated herein can be adapted to all semiconductor alloy systems and different wavelengths.

In the above embodiments it will often be useful in many material systems to add a highly doped smaller bandgap contacting layer on top of the top cladding layer. If the top cladding layer is made sufficiently thick, this will have negligible effort on the lowest-order optical mode and will reduce contact resistance. If the buffer layer is larger bandgap than the substrate, which will be true in some material systems such as $Al_xGa_{1-x}As$ grown on GaAs, it will also generally be necessary to keep the buffer layer thickness above some minimum value so the substrate does not effect the lowest-order optical mode.

Other types of gain regions instead of the quantum well gain regions illustrated can be employed in the SCOWL structures. The gain region can contain quantum dots, quantum wires or quantum dots or quantum wires incorporated in one or more quantum wells. Thin bulk-like gain regions, i.e., a region containing a layer or layers of sufficient thickness that the gain characteristics are essentially those of a bulk 3-dimensional semiconductor can also be employed.

As shown in FIGS. 9 and 10, it is possible to use a waveguide above and below the quantum well gain region to tailor the lowest-order mode profile. In general the upper lower waveguide regions will have different bandgaps and indices. This technique is applicable to all of the embodiments shown and is especially important for guides with very large lowest-order modes.

The embodiments shown can be used for a range of mode sizes. Although large mode sizes, on the order of 4 $\mu$m in both directions have been stressed, this technique of spatial mode filtering in lasers and amplifiers is also applicable for obtaining near-circular mode profiles of smaller dimension, but still larger than can be obtained in more conventional single-mode lasers and amplifiers.

The SCOWL embodiments illustrated are also applicable to optically pumped devices. For optically pumped devices all of the regions could be undoped and electrical contacts would not be needed.

Although the present invention has been shown and described with respect to several preferred embodiments thereof, various changes, omissions and additions to the form and detail thereof, may be made therein, without departing from the spirit and scope of the invention.

What is claimed is:

1. A laser and optical amplifier device comprising:
   a waveguide having a plurality of layers of semiconductor material with different optical indices, the waveguide including a first heightened region in a first of said layers, the first heightened region forming a channel along a longitudinal axis within which a lowest order spatial mode in both lateral and transverse directions is supported;
   an active region within a second layer near the first heightened region of the waveguide that is pumped to provide gain for said lowest order spatial mode in said waveguide; and
   first and second lateral regions, extending parallel to and on each side of said first heightened region along the longitudinal axis, into which all higher order spatial modes extend laterally and are suppressed, wherein the cross-sectional dimensions of the lowest order spatial mode are at least several times larger in both the transverse and lateral directions than the optical wavelength inside a dielectric medium of the waveguide.

2. The device of claim 1 further comprising second and third heightened regions, which extend parallel to and are separated from said first heightened region along the longitudinal axis, and include absorptive regions to provide loss for higher order spatial modes.

3. The device of claim 1, wherein loss in said first and second lateral regions is generated by bombardment of all or certain layers with protons or other damage-inducing ions to provide additional loss for higher order spatial modes.

4. The device of claim 1, wherein loss in said first and second lateral regions is generated by roughening the sidewalls of the device to further suppress higher order spatial modes.

5. The device of claim 1, wherein loss in said first and second lateral regions is generated by doping said regions to provide large free-carrier absorption which adds additional loss for higher order spatial modes.

6. The device of claim 1, wherein the cross-sectional dimensions of the lowest order spatial mode are at least an order of magnitude larger than the optical wavelength inside the dielectric medium of the waveguide.

7. The device of claim 2, wherein the cross-sectional dimensions of the lowest order spatial mode are at least an order of magnitude larger than the optical wavelength inside the dielectric medium of the waveguide.

8. The device of claim 1, wherein the contours of constant optical intensity for the lowest order spatial mode supported within said waveguide are nearly circular.

9. The device of claim 1, wherein the contours of constant optical intensity for the lowest order spatial mode supported within said waveguide have an approximately elliptical shape with a small aspect ratio.

10. The device of claim 2, wherein the contours of constant optical intensity for the lowest order spatial mode supported within said waveguide are nearly circular.

11. The device of claim 2, wherein the contours of constant optical intensity for the lowest order spatial mode supported within said waveguide have an approximately elliptical shape with a small aspect ratio.

12. The device of claim 2, wherein the first heightened region in the waveguide is defined by a region between two parallel etched channels in said layers, and wherein said second and third heightened regions are positioned outside the two parallel etched channels.

13. A slab coupled optical waveguide laser comprising:
a waveguide having a plurality of layers of semiconductor material with different optical indices, the waveguide including a first heightened region in a first of said layers, the first heightened region forming a channel along a longitudinal axis within which a longitudinal lowest order spatial mode in both lateral and transverse directions is supported;
an active region within a second layer near the first heightened region of the waveguide that is pumped to provide gain for said lowest order spatial mode in said waveguide; and
first and second lateral regions, extending parallel to and on each side of said first heightened region along the longitudinal axis, into which all higher order spatial modes extend laterally and are suppressed.

14. The device of claim 1, wherein a quantum well region provides gain.

15. The device of claim 1, wherein a quantum well region comprising one or more quantum wells, barrier layers and bounding layers provides gain.

16. The device of claim 1, wherein a strained-layer quantum well region provides gain.

17. The device of claim 1, wherein a strained-layer quantum well region comprising one or more quantum wells, barrier layers and bounding layers provides gain.

18. The device of claim 1, wherein a region containing quantum dots or quantum wires provides gain.

19. The device of claim 1, in which a region containing quantum dots or quantum wires inside one or more quantum well layers provides gain.

20. The device of claim 1, wherein gain is provided by a region containing one or more semiconductor layers.

21. The device of claim 2, wherein the regions between the first and second heightened regions and between the first and third heightened regions are filled with high resistivity material.

22. The device of claim 1, wherein plurality of layers of semiconductor material with different optical indices are made of III–V compound semiconductors.

23. The device of claim 1, wherein plurality of layers of semiconductor material with different optical indices are made in the $In_xGa_{1-x}As_yP_{1-y}$ semiconductor system on an InP substrate.

24. The device of claim 1, wherein plurality of layers of semiconductor material with different optical indices are made in the $Al_xGa_yIn_{1-x-y}As$ semiconductor system on an InP substrate.

25. The device of claim 1, wherein plurality of layers of semiconductor material with different optical indices are made in a combination of the $Al_xGa_yIn_{1-x-y}As$ and $In_xGa_{1-x}As_yP_{1-y}$ semiconductor systems on an InP substrate.

26. The device of claim 1, wherein plurality of layers of semiconductor material with different optical indices are made in the $Al_xGa_{1-x}As$ semiconductor system on a GaAs substrate.

27. The device of claim 1, wherein plurality of layers of semiconductor material with different optical indices are made in the $Al_xGa_yIn_{1-x-y}As$ semiconductor system on a GaAs substrate.

28. The device of claim 1, wherein plurality of layers of semiconductor material with different optical indices are made in a combination of the $Al_xGa_{1-x}As_z$ and $In_xGa_{1-x}As$ semiconductor systems on a GaAs substrate.

29. The device of claim 1, wherein plurality of layers of semiconductor material with different optical indices are made in a the $Ga_yIn_{1-y}As_zP_{1-z}$ semiconductor systems on a GaAs substrate.

30. The device of claim 1, wherein plurality of layers of semiconductor material with different optical indices are made in a the $Al_xGa_yIn_{1-x-y}As_zP_{1-z}$ semiconductor systems on a GaAs substrate.

31. The device of claim 1, wherein plurality of layers of semiconductor material with different optical indices are made in a combination of the $Al_xGa_yIn_{1-x-y}As_zP_{1-z}$ and $In_xGa_{1-x}As_yP_{1-y}$ semiconductor systems on a GaAs substrate.

32. The device of claim 1, wherein plurality of layers of semiconductor material with different optical indices are made in the $Al_xGa_yIn_{1-x-y}As_zSb_{1-z}$ semiconductor system on an InP substrate.

33. The device of claim 1, wherein plurality of layers of semiconductor material with different optical indices are made in a combination of the $Al_xGa_yIn_{1-x-y}As_zSb_{1-z}$ and $In_xGa_{1-x}As_yP_{1-y}$ semiconductor systems on an InP substrate.

34. The device of claim 1, wherein plurality of layers of semiconductor material with different optical indices are made in the $Al_xGa_yIn_{1-x-y}As_zSb_{1-z}$ semiconductor system on a GaSb substrate.

35. The device of claim 1, wherein plurality of layers of semiconductor material with different optical indices are made in the $Al_xGa_yIn_{1-x-y}As_zSb_{1-z}$ semiconductor system on an InAs substrate.

36. The device of claim 1, wherein plurality of layers of semiconductor material with different optical indices are made in the $Al_xGa_yIn_{1-x-y}N$ semiconductor system on a GaN substrate.

37. The device of claim 1, wherein plurality of layers of semiconductor material with different optical indices are made in the $Al_xGa_yIn_{1-x-y}N$ semiconductor system on a sapphire substrate.

38. The device of claim 1, wherein plurality of layers of semiconductor material with different optical indices are made in the $Al_xGa_yIn_{1-x-y}N$ semiconductor system on a SiC substrate.

39. The device of claim 1, wherein plurality of layers of semiconductor material with different optical indices are made in a the $Al_xGa_yIn_{1-x-y}As_zN_{1-z}$ semiconductor systems on a GaAs substrate.

40. The device of claim 1 wherein plurality of layers of semiconductor material with different optical indices are made of II–VI compound semiconductors.

41. The device of claim 1 wherein plurality of layers of semiconductor material with different optical indices are made of IV–VI compound semiconductors.

42. A laser and optical amplifier device comprising:
a waveguide having a first heightened region in a first layer, the first heightened region forming a channel along a longitudinal axis within which a lowest order spatial mode in both lateral and transverse directions is supported;
an active region, near the first heightened region of the waveguide, is pumped to provide gain for said lowest order spatial mode in said waveguide; and
first and second lateral regions, extending parallel to and on each side of said first heightened region along the longitudinal axis, into which all higher order spatial modes extend laterally and are suppressed, wherein the cross-sectional dimensions of the lowest order spatial mode are at least several times larger in both the transverse and lateral directions than the optical wavelength inside a dielectric medium of the waveguide.

43. The device of claim 42 further comprising second and third heightened regions, which extend parallel to and are separated from said first heightened region along the longitudinal axis, and include absorptive regions to provide loss for higher order spatial modes.

44. The device of claim 42, wherein loss in said first and second lateral regions is generated by bombardment of all or certain layers with protons or other damage-inducing ions to provide additional loss for higher order spatial modes.

45. The device of claim 42, wherein loss in said first and second lateral regions is generated by roughening the sidewalls of the device to further suppress higher order spatial modes.

46. The device of claim 42, wherein loss in said first and second lateral regions is generated by doping said regions to provide large free-carrier absorption which adds additional loss for higher order spatial modes.

47. The device of claim 42, wherein the cross-sectional dimensions of the lowest order spatial mode are at least an order of magnitude larger than the optical wavelength inside the dielectric medium of the waveguide.

48. The device of claim 43, wherein the cross-sectional dimensions of the lowest order spatial mode are at least an order of magnitude larger than the optical wavelength inside the dielectric medium of the waveguide.

49. The device of claim 42, wherein the contours of constant optical intensity for the lowest order spatial mode supported within said waveguide are nearly circular.

50. The device of claim 42, wherein the contours of constant optical intensity for the lowest order spatial mode supported within said waveguide have an approximately elliptical shape with a small aspect ratio.

51. The device of claim 43, wherein the contours of constant optical intensity for the lowest order spatial mode supported within said waveguide are nearly circular.

52. The device of claim 43, wherein the contours of constant optical intensity for the lowest order spatial mode supported within said waveguide have an approximately elliptical shape with a small aspect ratio.

53. The device of claim 43, wherein the first heightened region in the waveguide is defined by a region between two parallel etched channels in said layers, and wherein said second and third heightened regions are positioned outside the two parallel etched channels.

54. The device of claim 42, wherein a quantum well region provides gain.

55. The device of claim 42, wherein a quantum well region comprising one or more quantum wells, barrier layers and bounding layers provides gain.

56. The device of claim 42, wherein a strained-layer quantum well region provides gain.

57. The device of claim 42, wherein a strained-layer quantum well region comprising one or more quantum wells, barrier layers and bounding layers provides gain.

58. The device of claim 42, wherein a region containing quantum dots or quantum wires provides gain.

59. The device of claim 42, in which a region containing quantum dots or quantum wires inside one or more quantum well layers provides gain.

60. The device of claim 42, wherein gain is provided by a region containing one or more semiconductor layers.

61. The device of claim 43, wherein the regions between the first and second heightened regions and between the first and third heightened regions are filled with high resistivity material.

62. The device of claim 42, said waveguide is comprised of a plurality of layers of semiconductor material with different optical indices.

63. The device of claim 62, wherein said plurality of layers of semiconductor material with different optical indices are made of III–V compound semiconductors.

64. The device of claim 62, wherein said plurality of layers of semiconductor material with different optical indices are made in the $In_xGa_{1-x}As_yP_{1-y}$ semiconductor system on an InP substrate.

65. The device of claim 62, wherein said plurality of layers of semiconductor material with different optical indices are made in the $Al_xGa_yIn_{1-x-y}As$ semiconductor system on an InP substrate.

66. The device of claim 62, wherein said plurality of layers of semiconductor material with different optical indices are made in a combination of the $Al_xGa_yIn_{1-x-y}As$ and $In_xGa_{1-x}As_yP_{1-y}$ semiconductor systems on an InP substrate.

67. The device of claim 62, wherein said plurality of layers of semiconductor material with different optical indices are made in the $Al_xGa_{1-x}As$ semiconductor system on a GaAs substrate.

68. The device of claim 62, wherein said plurality of layers of semiconductor material with different optical indices are made in the $Al_xGa_yIn_{1-x-y}As$ semiconductor system on a GaAs substrate.

69. The device of claim 62, wherein said plurality of layers of semiconductor material with different optical indices are made in a combination of the $Al_xGa_{1-x}As_z$ and $In_xGa_{1-x}As$ semiconductor systems on a GaAs substrate.

70. The device of claim 62, wherein said plurality of layers of semiconductor material with different optical indices are made in a the $Ga_yIn_{1-x}As_zP_{1-z}$ semiconductor systems on a GaAs substrate.

71. The device of claim 62, wherein said plurality of layers of semiconductor material with different optical indices are made in a the $Al_xGa_yIn_{1-x-y}As_zP_{1-z}$ semiconductor systems on a GaAs substrate.

72. The device of claim 62, wherein said plurality of layers of semiconductor material with different optical indices are made in a combination of the $Al_xGa_yIn_{1-x-y}As_zP_{1-z}$ and $In_xGa_{1-x}As_yP_{1-y}$ semiconductor systems on a GaAs substrate.

73. The device of claim 62, wherein said plurality of layers of semiconductor material with different optical indices are made in the $Al_xGa_yIn_{1-x-y}As_zSb_{1-z}$ semiconductor system on an InP substrate.

74. The device of claim 62, wherein said plurality of layers of semiconductor material with different optical indices are made in a combination of the $Al_xGa_yIn_{1-x-y}As_zSb_{1-z}$ and $In_xGa_{1-x}As_yP_{1-y}$ semiconductor systems on an InP substrate.

75. The device of claim 62, wherein said plurality of layers of semiconductor material with different optical indices are made in the $Al_xGa_yIn_{1-x-y}As_zSb_{1-z}$ semiconductor system on a GaSb substrate.

76. The device of claim 62, wherein said plurality of layers of semiconductor material with different optical indices are made in the $Al_xGa_yIn_{1-x-y}As_zSb_{1-z}$ semiconductor system on an InAs substrate.

77. The device of claim 62, wherein said plurality of layers of semiconductor material with different optical indices are made in the $Al_xGa_yIn_{1-x-y}N$ semiconductor system on a GaN substrate.

78. The device of claim 62, wherein said plurality of layers of semiconductor material with different optical indices are made in the $Al_xGa_yIn_{1-x-y}N$ semiconductor system on a sapphire substrate.

79. The device of claim 62, wherein said plurality of layers of semiconductor material with different optical indices are made in the $Al_xGa_yIn_{1-x-y}N$ semiconductor system on a SiC substrate.

80. The device of claim 62, wherein said plurality of layers of semiconductor material with different optical indices are made in a the $Al_xGa_yIn_{1-x-y}As_zN_{1-z}$ semiconductor systems on a GaAs substrate.

81. The device of claim 62, wherein said plurality of layers of semiconductor material with different optical indices are made of II–VI compound semiconductors.

82. The device of claim 62, wherein said plurality of layers of semiconductor material with different optical indices are made of IV–VI compound semiconductors.

* * * * *

UNITED STATES PATENT AND TRADEMARK OFFICE
CERTIFICATE OF CORRECTION

PATENT NO. : 6,928,223 B2
DATED : August 9, 2005
INVENTOR(S) : Walpole et al.

It is certified that error appears in the above-identified patent and that said Letters Patent is hereby corrected as shown below:

Title page, Item [54] and Column 1, line 1,
Title, delete "STAB" and replace with -- SLAB --.

Column 21,
Line 5, delete "$Ga_yIn_{1-x}As_zP_{1-z}$" and replace with -- $Ga_yIn_{1-y}As_zP_{1-z}$ --.

Signed and Sealed this

Twenty-seventh Day of September, 2005

JON W. DUDAS
*Director of the United States Patent and Trademark Office*